United States Patent [19]

Johnston

[11] 4,283,772

[45] Aug. 11, 1981

[54] PROGRAMMABLE TIME REGISTERING AC ELECTRIC ENERGY METER HAVING ELECTRONIC ACCUMULATORS AND DISPLAY

[75] Inventor: Paul M. Johnston, Raleigh, N.C.

[73] Assignee: Westinghouse Electric Corp., Pittsburgh, Pa.

[21] Appl. No.: 25,647

[22] Filed: Mar. 30, 1979

[51] Int. Cl.³ .................. G01R 11/57; G01R 11/24; G01R 21/06; G06F 15/56
[52] U.S. Cl. ................................. 364/900; 364/483; 324/103 R; 324/142
[58] Field of Search ... 364/900 MS File, 200 MS File, 364/483, 492, 464; 324/76 R, 78 D, 103 R, 115, 110, 112, 113, 99 D, 142; 235/432; 340/310 A, 151; 346/14 MR; 361/79, 86, 87

[56] References Cited

U.S. PATENT DOCUMENTS

| | | | |
|---|---|---|---|
| 3,652,838 | 3/1972 | Dillon et al. | 364/493 |
| 3,872,286 | 3/1975 | Putman | 364/464 |
| 4,050,020 | 9/1977 | Germer et al. | 324/116 |
| 4,075,699 | 2/1978 | Schneider et al. | 364/492 |
| 4,080,568 | 3/1978 | Funk | 324/142 |
| 4,093,997 | 6/1978 | Germer | 364/900 |
| 4,120,031 | 10/1978 | Kincheloe et al. | 364/464 |
| 4,161,720 | 7/1979 | Bogacki | 340/150 |
| 4,162,530 | 7/1979 | Kusui et al. | 364/464 |
| 4,207,557 | 6/1980 | Gilkeson et al. | 324/142 |
| 4,233,590 | 11/1980 | Gilkeson et al. | 324/142 |

Primary Examiner—Mark E. Nusbaum
Assistant Examiner—C. T. Bartz
Attorney, Agent, or Firm—E. L. Pencoske

[57] ABSTRACT

An AC electric energy meter includes a metering sequence logic control circuit for receiving pulses responsive to an AC energy quantity to be measured. Electric energy parameters are measured by the control circuit as it concurrently registers clock time and calendar data. A programmable rate selection table controls variable time intervals for accumulating different parameters during predetermined daily time measuring categories corresponding to different billing rates. The rate selection table includes plural rate switch control points defining daily measuring times nominally on a day of the week basis. A programmable yearly date code table designates days during the year for still different daily code times. The measured parameters are stored in separate electronic registers so as to have coded values of kilowatthours and/or kilowatt demand for direct electronic display in a multiplexed and reoccurring sequential order.

15 Claims, 16 Drawing Figures

PROGRAMMABLE TIME REGISTERING AC ELECTRIC ENERGY METER HAVING ELECTRONIC ACCUMULATORS AND DISPLAY

CROSS-REFERENCE TO RELATED APPLICATIONS

The present invention is related to U.S. Patent Application Ser. No. 25,514 for "A Portable Programmer-Reader Unit For Programmable Time Registering Electric Energy Meters", filed concurrently with this application and assigned to the assignee of this invention and is incorporated herein by reference.

BACKGROUND OF THE INVENTION

Measurements of electric energy for billing purposes are known to be performed by meters capable of making measurements for different times of use or consumption basis so that different billing rates can be applied for electric energy used during different time intervals of each day. Earlier meters of the so-called time of day type utilize an induction watthour meter movement with multi-dial registers for selectively engaging separate register dials under the control of a mechanical clock mechanism. Many prior art multirate or time of day meters are fixed as to the electric energy parameter measurements that can be made and have limited flexibility for establishing different measuring time intervals. Typically, the only differences of daily measuring time schedules are provided between a weekday rate and a weekend. There are often considerable time and date cyclic variations in the demand for electric power supplied by an electric utility. It is a general object in the time of day type of meters to correlate the time intervals wherein different levels of power demand are occurring in an electric utility distribution system with the different categories of electricity usage measuring times. The electric power demand can vary on the basis of not only the days of the week but also vary differently on either Saturdays or Sundays, holidays and/or yearly seasonal basis, for example, winter seasons have earlier darkness and electric heating loads dominating demand while summer seasons have later darkness and electric air conditioning loads dominating demand.

Accordingly, it is desirable to have an AC electric energy meter which is capable of providing multiple measuring functions for totalizing and indicating different parameters of the consumption of AC electric energy and to totalize such parameters in different measuring time categories during each day of measurement. Such meters must permit wide flexibility for multirate billing for electric energy consumption and ease of making changes between the different parameters to be measured and the schedules for making the measurements. The use of such meters is often effective in reducing peak demands of electric energy usage and facilitates conservation in the use of electric energy.

The application of solid state electronic circuits and devices to time of day electric energy measurements affords greater flexibility in increasing the number of electric energy measurement parameters that may be made and increased flexibility in rate selection schedules possible for the electric energy billing operation than was afforded by earlier primarily electromechanical meters. The use of such solid state electronic circuits and devices present a number of different considerations so that the meters remain with the same operating capabilities of earlier electromechanical billing meters in that they must be accurate, rugged and reliable in operating in outdoor environments subject to wide variations in environmental temperature extremes and remain compact in size, capable of being assembled and manufactured by mass production techniques and have acceptable cost. High accuracy in both measuring and time and date recording operations is necessary while utilizing a minimum number of circuits for maintaining an optimum size and operation at acceptable power supply levels. The meter must be secure from tampering and alteration of the operation thereof, require minimum service and maintenance, and be further capable of operating for extended time under battery power during the power outage conditions of the electric energy quantity being measured. The aforementioned requirements and considerations are maintained in providing the programmable time registering AC electric energy meter of this invention as described briefly hereinafter.

SUMMARY OF THE INVENTION

In accordance with the present invention, a programmable time registering AC electric energy meter includes a solid state metering sequence logic control circuit having a programmed sequence of operation. A timing circuit produces pulses at regular intervals to the control circuit so that in a time keeping mode of operation time data is produced in seconds, minutes, hours and days of the week, and alternatively, in days of the year. The current real clock time and calendar date data are stored in electronic registers. In a measuring mode of operation of the control circuit, it receives electronic metering pulses produced by an electric energy to pulse rate converter in response to the consumption of electric energy. Measured values of different electric energy usage parameters, including kilowatthours (KWH) and kilowatt demand (KWD), are produced as the AC electric energy quantity is measured. Plural separate electronic accumulators or registers separately accumulate coded values of the metering pulses as they occur during different programmed measuring time intervals. Each of the KWH and KWD parameters are stored in different registers during different measuring times. Three measuring time categories are provided for corresponding to three billing rate categories. The rates are designated as peak or high rate, mid or shoulder rate and off-peak or base rate for purposes of establishing different rate and pricing schedules for billing and for controlling the use of the measured AC electric energy quantity.

Further registers store a rate schedule table including a plurality of coded rate switch control or set points defining real clock times and weekly calendar dates for changing from one measuring time or billing rate category to another. A date code table is stored in further registers of the rate schedule table for defining coded yearly calendar dates for further variations in the rates of measurement, such as during holidays and summer or winter seasonal dates. Selection of a rate switch point is accomplished by the control circuit comparing the current time and date to the rate schedule table. The measuring values of the metering pulses are accumulated in different ones of six measuring time related differentiated data storage registers, three each for KWH and KWD. Further data accumulating registers are provided for continuously accumulating the cumulative total of both KWH and KWD electric energy usage.

The values of KWH and KWD are accumulated so as to not lose fractional values of the parameters as the metering pulses are accumulated.

The programmed sequence of operation of the control system is controlled in part by replaceable and alterable program control data including the rate selection and date code tables. Registering and recording of current time and date data and comparison of the current time and date data relative to the programmed rate switch control points is provided for establishing a change between measuring time categories in accordance with sequence control instructions of a fixed program memory. Conversion factors defined by meter constants data are used in the program control data to efficiently accumulate the values of the measuring parameters from the metering input pulses. Initial accumulation of metering data is provided in fractional quantity accumulation registers.

The recorded time and date data and each of the time related parameters of KWH and KWD are sequentially applied to an opto-electronic readout display. The display sequentially displays time in hours, minutes, day of the week and day of the year. Also displayed are the accumulated electric energy usage parameters of total KWH, and KWH for the high rate, mid-rate, and base rate periods, and the three accumulated electric power demand parameters of KWD for the high rate, mid-rate, and base rate periods of measurement. The sequential displaying of the time and measured parameter values substantially reduces the size, complexity and power consumption of the circuits required to produce such displays.

In one preferred embodiment of the invention, metering pulses are developed by an electromechanical induction watthour meter movement equipped with a pulse initiator for generating metering pulses at a rate responsive to the consumption of the electrical energy quantity being measured. A mechanical register may be included for further registering the total consumption of electric energy in response to the rotation of a disc shaft also producing the metering pulses. The metering pulses are received and accumulated as incremental values of KWH and KWD in designated storage registers. The measuring values of the pulses are selectively stored in the different measuring time categories each corresponding to the predetermined billing rate category embracing the current measuring time interval.

When timing pulses are applied to an interrupt input of the control circuit, a timer interrupt operating routine is initiated to store updated time of day and calendar date data. The time updating operation is effective to increment a seconds counter register, a minutes counter register, an hours counter register, and day of the week and day of the year counter registers when such updating is necessary. Accordingly, as seconds accumulate, the minutes counter will then be updated, and as the minutes count accumulates, the hour counter will be incremented and when twenty-four hours are accumulated, a day of the week counter will be updated. Optionally, the control circuit is operable in either a limited 7-day or a continuing 365-day calendar mode of operation or various modifications thereof. A day of the year counter register accumulates the coded numerical value day of the year and a further program control records whether or not the current year is a leap year. The timer interrupt operation ends when all time and date data is updated in response to the one second timing signals generated from the AC energy being measured or, during a power outage, a battery powered oscillator and timer circuit which generates auxiliary timing signals. A separate battery use time counter register separately accumulates time during power outages so the battery life condition can be monitored. A demand interval time counter forms a still further time accumulating register required for KWD measurement.

The meter also provides date coding capable of adjusting current time recording for daylight savings time changes and for programming of the season changes in the daily measuring times schedule. Also, the date code stores yearly holiday day dates for providing a separate schedule for holidays. The current time and date data and coded yearly dates data provide the time and date information for comparison with the rate selection schedule.

A rate selection operating routine compares the programmed rate switch control point times with the real time and date. The rate selection table contains coded times in time of day, in hours and minutes; codes the type of day of the week, whether the switch point is in a weekday, Saturday, Sunday or holiday; and whether a particular rate switch time falls within either a winter or summer season. A series of flag codes are established in temporary or working logic storage registers for comparing a current day and date with one of the coded rate switch control points of the rate selection and schedule table. When a match of the switch point is found, a rate switch changeover operation occurs to change between the registers effective to accumulate the values of the measured parameters represented by the metering pulses. Thus, the pulses are selectively accumulated in either base rate KWH hour and KWD registers or mid-rate KWH and KWD registers, or on-peak or high rate KWH and KWD accumulating registers. The rate schedules are cyclically processed so that a perpetual operation can occur not limited to a single complete year.

The meter has a display sequence operating routine where the control circuit reads out the existing accumulated values of each one of the multirate KWH and KWD storage registers and of the cumulative KWH storage registers. The control circuit has display indicator identification codes to designate and identify the KWH and KWD data quantities and time and date quantities when displayed. The associated billing rate category is identified by a numerical digit which is displayed concurrently with the KWH or KWD reading of the associated rate. Since pulses are converted to KWH or KWD measured values before storing, they are efficiently applied to display decoding and visual optoelectronic readout circuits. The KWH and KWD readouts are preferably ones having five numerical digits displayed with an associated display identification digit. Accordingly, the three rates of the two measured parameters are numerically displayed at six separate times with an associated coded identification numerical designation. Effectively, an electronic multifunctional register is provided, rather than a mechanical dial register with gear trains for electronically accumulating and providing a readout display at the front of the meter indicating the values of the measured parameters as they occur. Concurrent with the sequential readout of the KWH and KWD measured values, with optional ones not being displayable, the current time in hours and minutes, current dates in day of the week and day of the year are also displayed with an identification code. A further provision of the display includes a displayed error indication in a hybrid alphabetic form. The digits of the display are sequentially energized at high frequency in a multiplex fashion as the time related metering operations occur in repetitive sequences without effecting the visual presentation of the readout data.

Data checking of stored calculation constants data is provided to verify operation of the control circuit. The sums of certain constant data items are calculated and compared to a known sum. The manner of accumulating KWH and KWD is based on the use of fractional KWH and KWD registers that accumulate fractional KWH and KWD values of the metering pulses. When a designated quantum of KWH and KWD is reached, (such one kilowatthour or 1/100 of a kilowatt demand) the values in KWH and KWD accumulating registers are advanced by the quantum value. The stored values are accurately maintained to assure accuracy and correspondence between the electronic readings and the dial readings of a mechanical register since both are responsive to the same meter disc rotations in one preferred embodiment. Optimum use of the electronic circuit arrangement includes the use of a microprocessor central processing unit (CPU) having an arithmetic logic unit performing the arithmetic, comparison and other logical operations. An external random access memory (RAM) is uniquely connected to the input-output ports of the CPU to avoid the use of additional and higher power consuming RAM addressing and interfacing circuits. The meter is further operative with a programmer-reader unit to initialize, selectively reprogram, read the electronically stored measuring data, not limited to only the meter display data, and perform data verification and checking including time and date synchronization. A security function of the meter includes two security code registers in which one is an old code and the other a new code with respect to initial and terminating sequences of a single communication cycle of data transfer operation with a programmer reader unit. This enables the programmer-reader unit to record if there has been authorized or unauthorized data transfers to the meter. These and other features and advantages of the present invention will become apparent from the detail description of a preferred embodiment shown in the drawing briefly described hereinafter.

DETAILED DESCRIPTION OF THE PREFERRED EMBODIMENT

Figure 1:
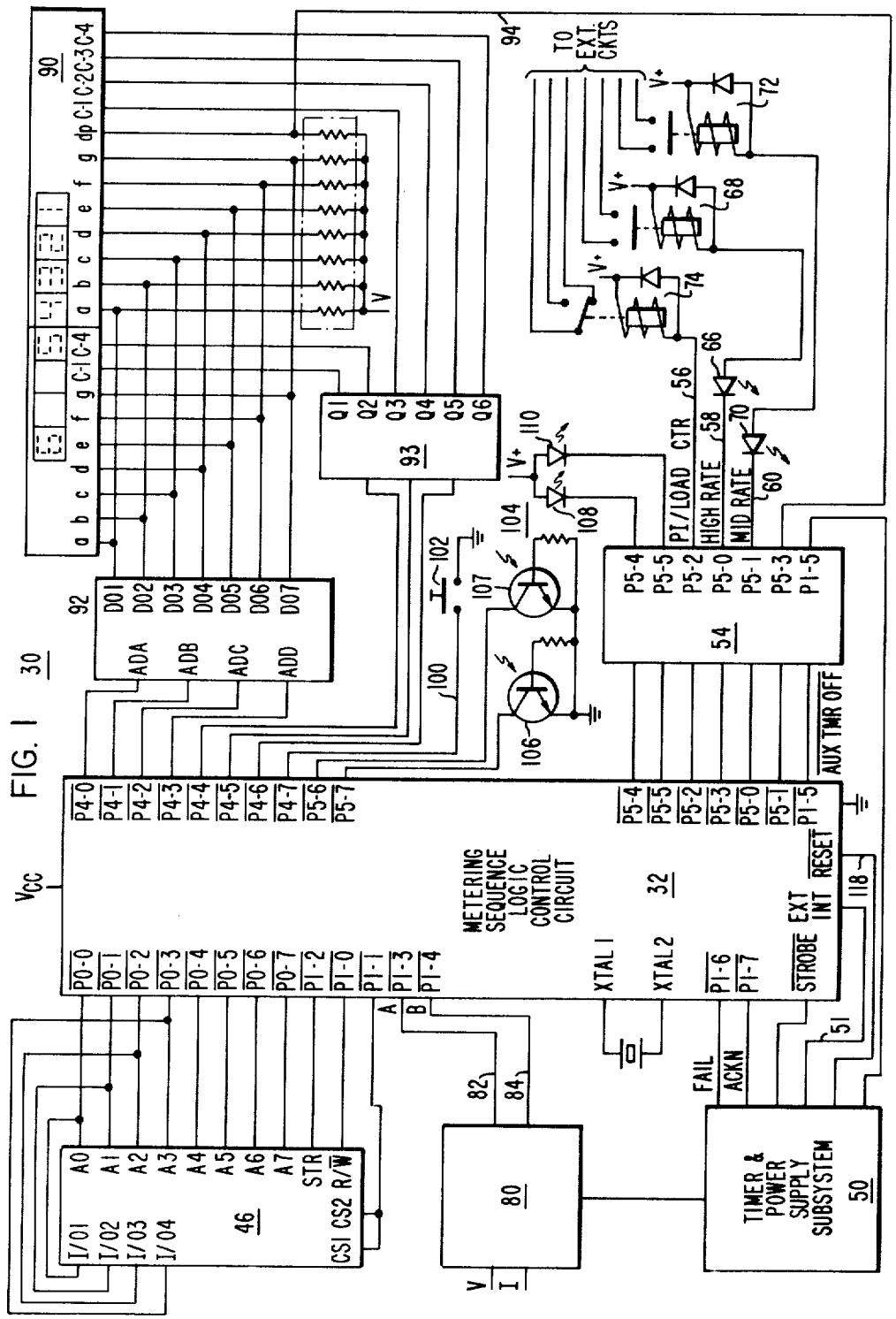
FIG. 1 illustrates an electrical schematic diagram of a programmable time registering AC electric energy meter made in accordance with the present invention.

Referring now to FIG. 1 there is shown an electrical schematic diagram of a programmable time registering AC electric energy meter 30 for providing a programmable time based multi-functional metering operation in accordance with the present invention. Certain aspects of the present invention are described in U.S. Patent Application Ser. No. 891,997 for "A Programmable AC Electric Energy Meter Having Radiation Responsive External Data Interface", and U.S. Pat. No. 4,197,582 for "An Auxiliary Power Supply And Timer Arrangement For Time Registering Multifunctional Electric Energy Meters", both filed Mar. 31, 1978 and assigned to the assignee of this invention and incorporated herein by reference. A metering sequence logic control circuit 32 uses an F8 microcontroller type microprocessor chip 32 type MK 3870 available from Mostek Corp. and described in the publication entitled: F8 Microprocessor Devices, Single-Chip Microcomputer MK 3870, available from the aforementioned Mostek Corp., Carroltown, Texas 75006. As described in the aforementioned publication, the metering sequence logic control circuit 32 provides multifunction logic operations and generally includes the following subsystems: A control logic and instruction register, an accumulator and status register, an arithmetic and logic unit (ALU), shown at 34 in FIG. 2, a program read only memory (ROM) shown at 36 in FIG. 2 having a control program code of instructions for controlling the sequence of operations of the meter 30, a timer and interrupt logic and an internal clock. The ALU 34 performs the arithmetic operations of binary add, decimal adjust, add with carry, decrement and the logic operations of AND, OR, 1's complement, and shift left and right. The same logical and arithmetic functions as described herein may be performed by separate logic circuits having operations dedicated to the operations and data items of the meter 30.

Figure 2:
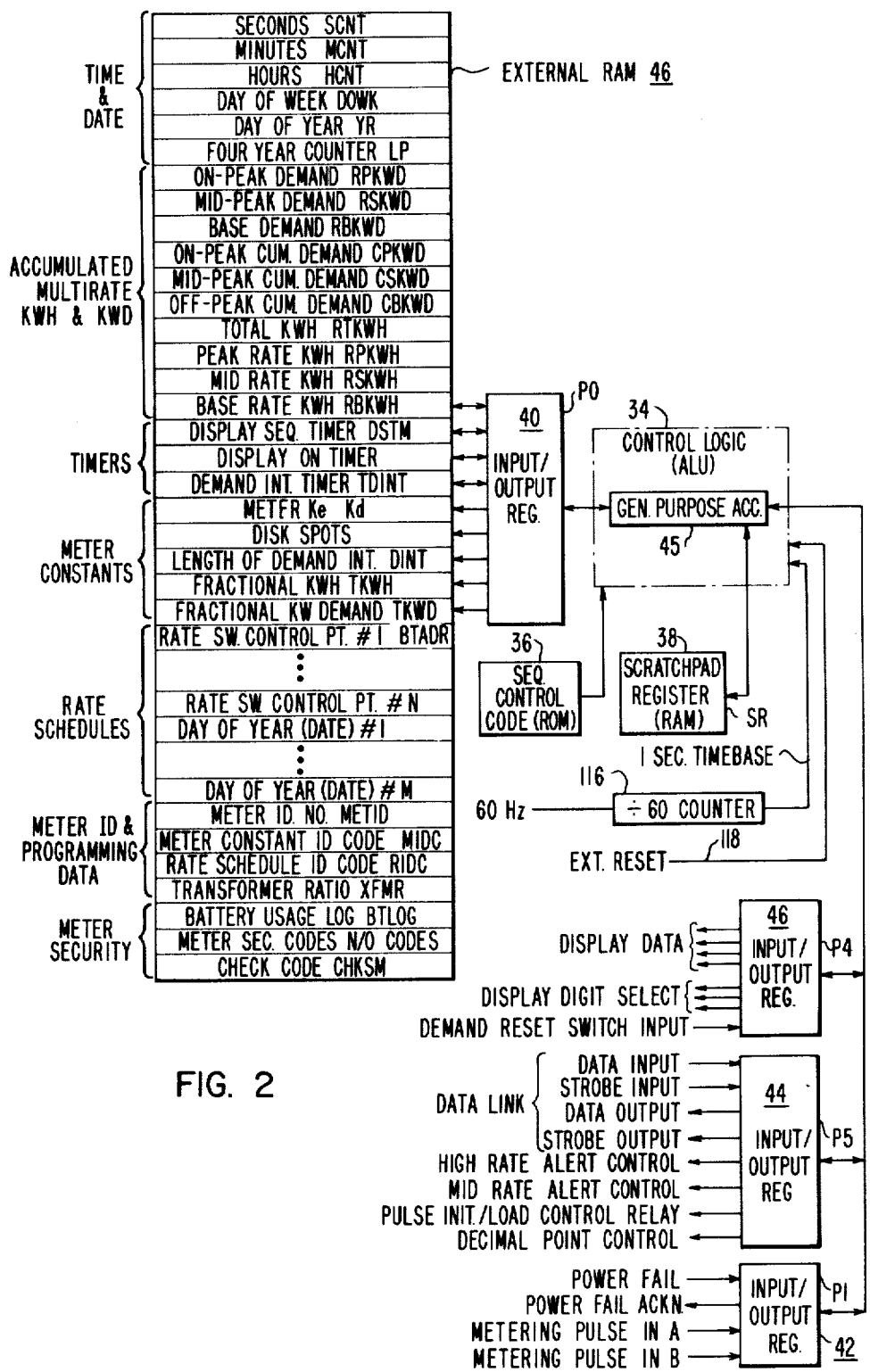
FIG. 2 is a functional block schematic diagram of the data processing portion of the meter shown in FIG. 1 including a control logic block for receiving and processing the indicated data items.

The logic control circuit 32 further includes a scratchpad register 38, shown in FIG. 2, internally providing a sixty four word, eight bit general purpose read/write RAM memory with an associated scratchpad addressing register called ISAR holding two octal digits. The data and organization of scratchpad register 38 is described further hereinbelow. Bidirectional input/output (I/O) ports P0, P1, P4 and P5 correspond to the input/output registers 40, 42, 44 and 46 shown in FIG. 2. Binary logic data signals are transferred to and from the control circuit 32, also described further hereinbelow, through the I/O ports to communicate external binary signals with the ALU control logic 34 for producing the arithmetic and logic operations therein. A general purpose accumulator (ACC) 45, shown in FIG.

2, receives inputs for the ALU and stores the results of ALU operations.

Associated with the control circuit 32 is an external read/write data memory provided by random access memory (RAM) 46 for receiving and sending data and processing time related data to be related to the electric energy measurements provided by the meter 30 as described further hereinbelow. The coded logic of RAM 46 includes various data items that form alterable meter program control data. The RAM data memory 46 is a four-bit by 256-word solid state low power CMOS random access memory type IM6561 which accumulates and stores the various data items shown in FIG. 2 as tabulated and described in a Table II included herein. The RAM 46 is connected to the control circuit 32 as shown in FIG. 1 without requiring additional interfacing or addressing logic as normally required. A timer and power supply subsystem 50 provides operation as described in the U.S. Pat. No. 4,197,582. Time base signals are applied on line 51 to the external interrupt input EXT INT.

Control data lines from port P5 are connected through the buffer 54 to the control data lines 56, 58, and 60. In accordance with a timed metering operation, as described hereinbelow of the meter 30, the data line 56 is activated for two modes of operation including providing pulse initiator type pulses for magnetic recording of metering pulses or providing a load control relay energization. The data line 58 is activated during an on-peak or high rate time, and the data line 60 is activated during a shoulder or mid peak time. The line 58 is connected in series with an high rate LED indicator 66 and a coil of relay switch 68. The data line 60 is connected in series with a mid-rate LED indicator 70 and a coil of relay switch 72. A coil of relay switch 74 having a three wire output is controlled by data line 56. The connections to the outputs of the switches 68, 72 and 74 may be to electric loads or switch 68 may be connected to a three wire mercury wetted relay for transmitting pulses to a record head of a billing or load survey magnetic recorder which are known in the art.

The meter 30 includes an AC electric energy to pulse rate converter 80 receiving voltage V and current I energy components. The converter 80 is formed by a pulse initiator circuit in one preferred embodiment. The pulse initiator converter 80 initiates electronic impulses in response to the rotation of a watthour meter disc for developing two alternately occurring metering pulses A and B on data lines 82 and 84. The metering pulses have a pulse repetition rate responsive to the rate of consumption of the electric energy quantity, typically having a sixty Hz frequency, to be measured. Electronic watthour transducer circuits can replace the pulse initiator type for use in converters 80 and are well known in the art for producing the metering pulses as disclosed in U.S. Pat. No. 3,733,493, issued May 15, 1973 U.S. Pat. No. 3,878,391, issued Apr. 15, 1975, and 3,943,498, issued Mar. 9, 1976, all assigned to the assignee of this invention. As set forth in one or more of the aforementioned patents each pulse produced in the metering pulses is representative of a predetermined quantum of kilowatthours (KWH) so as to have a pulse energy (KWH/pulse) value $K_e$. The constant $K_e$ is equal to the product of the watthour meter constant $K_h$ and the disc revolution per pulse constant $M_p$. The watthour meter constant $K_h$ is a factor relating the amount of rotation of a watthour meter disc to a predetermined quantum of electric energy in KWH. Similarly, a constant $K_d$ is defined as the kilowatt per pulse (KWD/pulse) value of the metering pulses and is equal to $K_d$ divided by a predetermined but variably fixed demand interval time in the present invention.

An optoelectronic visual display 90 is connected to ports P4 of the control circuit 32 and includes two four digit display circuits of a type 5082-7414 providing seven segment numerical LED display at each of eight display digits provided thereby. The top four data lines from port P4 are applied to a binary coded decimal (BCD) to seven segment encoder circuit 92 being of a type SN 54188JAJ. The circuit 92 selects the different ones of the seven output lines of circuit 92 in response to BCD coded inputs for selecting the predetermined ones of the seven segments to display a corresponding numeral or simulated hybrid alphabetical letters formed thereform to display "Error" and "A" or "P" (for a.m. or p.m.). The next three data lines from port P4 are applied to a three line to eight line decoder 93 type MC14028 which has six of the output lines connected through a buffer, not shown, including a type CA3081 to the digit select inputs of the display circuit 90. These digit select inputs are sequentially generated to effect multiplexing of the display digit elements as the encoder circuit 92 outputs the numeral or letter to be displayed at each of the eight digits. The digit selection is controlled by the logic control circuit 32 described further hereinbelow. The data line 94 is connected to the decimal point dp input of the display circuit 90. A data line 100 is also connected to port P4 and to a manual demand reset switch 102 which is operable through the cover of the meter to apply a demand reset logic signal to the control circuit 32. The demand reset function is also provided by communication with an associated programmer-reader unit.

A radiation sending and receiving data communication interface 104, described in further detail in application Ser. No. 891,997, is connected at port P5. The first and second radiation sensors 106 and 107 are connected to DATA IN and STROBE IN data lines to the port P5. Accordingly, radiation emitters 108 and 110 are connected through the buffer 54 to DATA OUT and STROBE OUT data lines also connected to port P5. External data transfer between the meter 30 and a portable programmer-reader unit, not shown, is performed as described in the above identified U.S. Pat. No. 4,197,582 and as further described hereinbelow. While the sequence control code program memory, shown at ROM 36 in FIG. 2, of the control circuit 32 is fixed, the external RAM data memory 46 requires the alterable program control data items thereof to be initially programmed therein. The electromagnetic radiation sending and receiving interface 104 receives the initial values of the data items into RAM 46 for use by the sequence of control code instructions stored in the program memory of ROM 36.

Before describing the details of the meter 30 and of all the data items of the RAM 46, it is generally noted that RAM data items are related to metering of three time differential rates or measuring times for metering time related KWH and KWD parameters. The rate times are designated as off-peak or base rate, mid-peak or shoulder rate and high or on-peak. In the present invention the three rates can be selected from a rate schedule shown in FIG. 2 and stored in RAM 46 as plural rate switch control point codes (#1-#N) and day of the year date codes (#1-#M). The rate switch point code has a type of day code for identifying four types of day of the week categories including weekdays, Saturday, Sunday or holidays with up to 30 holidays or other dates being programmable in the yearly date code. The rate switch control code defines one of the three on-peak, mid peak or base rates in each rate switch point code. A rate selection may be made on the basis of anyone of the type of day categories plus a summer or winter (S/W) seasonal rate category. Time in hours and minutes is stored in the time and date registers of RAM memory 46 for comparison to the rate selection table. The rate switch control points also contain a time of day in hours and minutes (in twelve, five minute increments), along with the type of day of the week code and the season code. Thus, the time of the type of day designated in the code effects the rate designated. The rate switch code further includes a load control relay coded bit so that the relay switch 74 can have a time schedule independent of the billing rate times. When the load control relay bit is a one, the code indicates that the load control relay switch is to be energized for controlling a load during that code's billing rate period.

The control circuit 32 is effective to establish a current time or time of day during a timer interrupt routine sequence of operation, described further below and in U.S. Pat. No. 4,197,582, in which the seconds counters, minutes counters, hours counters, day of the week counters and day of the year counters in RAM registers are continuously updated, when appropriate, on a one second basis. These time and dates provide a current time and date status for defining a reference rate code for comparison with each of the rate switch control point codes.

The yearly date codes in RAM 46 are coded for designating what days are holidays, season change dates, and daylight savings time change dates. The program checks current time against two daylight savings time adjustment dates, one occurring in the spring and the other in the fall, typically. There is a check of the yearly date code including holidays to indicate that a date is a holiday for matching of the type of day code in the rate switch code. A further check is made for finding whether a present day is in a winter or summer season status as designated by the date code for matching with the rate switch code. When a particular type of day, season, time in hours and minutes in the current time and date registers matches corresponding dates and time in the rate selection stored codes, the control circuit 32 initiates a change from one measuring time and the corresponding billing rate to the next time and rate. The generally described rate selection operations are to cause separate accumulation of the values of the measured parameters occurring during the three rates in the multirate KWH and KWD registers of RAM 46 including those for base rate kilowatthour (KWH) and kilowatt demand (KWD), and/or mid-rate KWH and KWD and/or peak rate KWH and KWD and cumulative KWH and KWD.

The above is a general description of the rate schedules and time and date registers of the data memory of the RAM 46 of FIG. 2. The operative interrelationships thereof are further described hereinafter for producing the time related multifunctional and multirate metering operations of the meter 30 by further reference to FIG. 2. The registers 42, 44, 46 and 48 receive and transmit the control data and metering pulses at data lines corresponding to those shown in FIG. 1. The data is processed in the control logic including the ALU 34 noted above. Timing signals are provided by a divide by sixty counter 116 receiving sixty Hz signals from the AC electric energy being measured to produce the timing signals as a one second time base on line 51 to the circuit 34. This is for normal operation without a power outage. The external reset EXT RESET line 118 resets the logic control circuit 32 of FIG. 1 to a known program state as is known. The sequence control code of the program memory ROM 36 contains the instructions for effecting the metering sequences of data processing.

The scratchpad register 38 provides temporary storage of data items corresponding to data items of the RAM 46 and further counter registers and control flags essential to indicate the states of various ones of the data items during sequences of operation. Computational steps and results are also processed in the individual registers of the scratchpad register 38. Table I defines the memory map of the scratchpad register 38 including the actual scratchpad register (SR) address of the eight bit (D7-D0) registers thereof and the associated mnemonics identifying the data items having the designated memory addresses and bit locations. The date code description for each of the data items is provided for understanding the the operation of the present invention. The coded status of data items of the RAM 46 and that of the control data at the input/output registers 40, 42, 44 and 46 are processed as coded binary 1 and 0 logic states in the corresponding data item bit locations or addresses of the scratchpad register 38. The Table I is as follows:

TABLE I

SCRATCHPAD REGISTER MAP
Eight Bit (D7-D0) by 64 Word Internal Memory

| SR Reg. (Octal) | Reg. Mnemonic | Bit Allocation | Register Data Code Description |
|---|---|---|---|
| 00 | R0 | D7-D0 | Workspace |
| to | to | " | Workspace |
| 07 | R7 | " | Workspace |
| 10 | R8 | " | RAM data mem. base address |
| 11 | R9 | " | Status Word Save Reg. |
| 12 | RA | " | Accumulator Save Reg. |
| 13 | RB | " | ISAR Save Reg. |
| 14 | KU | " | Return Address Regs. For Subroutine |
| 15 | KL | " | Nesting |
| 16 | QU | " | Temp. Regs. for Instructions to Load |
| 17 | QL | " | Data Counter |
| 20 | SCNT | D5-D0 | Secs. Counter (binary no.) |
| 21 | MCNT | D5-D0 | Mins. Counter (binary no.) |
| 22 | HCNT | D4-D0 | Hours Counter (binary no.) |
| 23 | DCNT | D7 | Pulse In Flag |
| " | " | D6 | Pulse Initiator Control Bit (Pulse Input ÷ 2) |

TABLE I-continued
SCRATCHPAD REGISTER MAP
Eight Bit (D7-D0) by 64 Word Internal Memory

| SR Reg. (Octal) | Reg. Mnemonic | Bit Allocation | Register Data Code Description |
|---|---|---|---|
| " | " | D5 | Day Change Flag, Set At Midnight |
| " | " | D4 | 7 day (1) or 365 day (0) mode Flag |
| " | " | D3 | Mp (0 or 1 = 2 or 4 spots/disk) |
| " | " | D2–D0 | Day of Week Counter |
| 24 | YR1 | D3–D0 | Day of Year Units digit (BCD) |
| " | " | D7–D4 | Days of Year Tens digit (BCD) |
| 25 | YR2 | D7 | Summer(1)/Winter(0) Flag. |
| " | " | D6 | Holiday Flag (1) |
| " | " | D5 | DSTR-Daylight Savings Time Reset (1) |
| " | " | D4 | DSTS-Daylight Savings Time Set (1) |
| " | " | D3&D2 | Leap Year Flags: |
| | | | 0,0 - This year is leap year |
| | | | 0,1 One year past leap year |
| | | | 1,0 - Two years past leap year |
| | | | 1,1 - Three years past leap year |
| " | " | D1&D2 | Day of Year Hundreds digit (BCD) |
| 26 | FLR1 | D7,D6 | Summer(1)/Winter(0) Flgs, (0) |
| " | " | D5&D4 | Day Code Flags: |
| | | | 0,0 - Weekday |
| | | | 0,1 - Saturday |
| | | | 1,0 - Sunday |
| | | | 1,1 - Holiday |
| " | " | D3 | Pulse Initiator Flag (Relay is to be used as pulse unit) |
| " | " | D2 | Min. Change Flag (set once each minute) |
| " | " | D1 | 0 |
| " | " | D0 | Load Control Flag (Relay is to be used as load control) |
| 27 | P5Im | D7,D6,D5 | Port 5 Image Reg.(0);(0); Strobe Out |
| " | " | D4,D3 | Data Out; DPSEL (decimal pt. sel.) |
| " | " | D2,D1 | Load Ctrl.; Mid Rate Ctrl.(0); |
| " | " | D0 | Hi Rate Ctrl.(0) |
| 30 | DPFLG | D7,D6 | Display Flags-Base KWD(1); Mid KWD(1) |
| " | " | D5,D4 | Hi KWD(1); Base KWH(1) |
| " | " | D3,D2 | Mid KWH(1); Hi KWH(1) |
| " | " | D1,D0 | Total KWH(1); Day of Year (1) |
| 31 | DSPID | D3–D0 | Display Indicator Digits 0-10 (BCD) These bits control data displayed in display digit #1. |

| | | | ID Quantity | Secs. | Digits |
|---|---|---|---|---|---|
| | | | 0 - Time of Day | 4 | 5 |
| | | | 1 - Day of Week | 2 | 2 |
| | | | 2 - Day of Year | 4 | 4 |
| | | | 3 - Total KWH | 6 | 6 |
| | | | 4 - Hi Rate KWH | 6 | 6 |
| | | | 5 - Mid Rate KWH | 6 | 6 |
| | | | 6 - Base Rate KWH | 6 | 6 |
| | | | 7 - Hi Rate KWD | 6 | 6 |
| | | | 8 - Mid Rate KWD | 6 | |
| | | | 9 - Base Rate KWD | 6 | 6 |
| | | | 10 - Display Test | 4 | 8 |
| 32 | DIG5 | D3–D0 | Display Digit 5 (msd) | | |
| 33 | DIG4 | | Display Digit 4 | | |
| 34 | DIG3 | | Display Digit 3 | | |
| 35 | DIG2 | | Display Digit 2 | | |
| 36 | DIG1 | | Display Digit 1 (lsd) | | |
| 37 | DDC | D7–D4 | Display Data Counter (0-11) | | |
| " | DSTM | D2–D0 | Display Seq. Timer Counter (two, four, six seconds) | | |
| 40 to 57 | | | Reserved for communication routines Reserved for communication routines | | |
| 60 to 62 | TKW(H/D) " | D7–D0 " | Fractional KWH or KWD register data Fractional KWH or KWD register data | | |
| 63 to 64 | KE or KD " | | Meter KWH or KWD Constant Meter KWH or KWD Constant | | |
| 65 to 67 | MULTP " | | Register Reset Constant Register Reset Constant | | |
| 70 | | D7–D0 | Display On Timer (0-120 secs.) | | |
| 71 | | D2–D0 | Display Digit Count (0-9$_{10}$) | | |

The data memory of external RAM 46 is shown in FIG. 2 with the principal data items utilized by the The timer counters within the external RAM 46 shown in FIG. 2 are separate time interval counter registers used to control the sequence of the several items indicated at the numerical display 90 and the length of time that the items are displayed, which is variable in accordance with the present invention. All the timer counters shown are preferably in scratchpad register 38 except TDINT. The demand interval timer TDINT is stored in RAM 46 in a manner that allows the demand interval to vary over a predetermined time period between one minute and four hours and fifteen minutes (255 minutes). The meter constants storage registers include the calculation conversion factors required to indicate the KWH and KWD value of the metering pulses. These constants were noted above and are more specifically described as used in the present invention hereinbelow. The rate schedules include both the rate switch control point codes and data codes shown in FIG. 2. Various combinations of the numbers of each of the type of codes are usable. For example, fifteen, four word switch point codes and twenty, three word date codes can be used in the one hundred twenty word or register spaces available in the RAM 46 or all could be used for either one of the codes.

The meter identification number and programming data items of RAM 46 are initially programmed from an associated programmer-reader unit as are all the fixed data items and the initial variable time and date data. The meter constant and rate schedule identification codes designate a particular set of each which are selected from plural sets, such as ten each, stored in a master program table in a programmer-reader unit.

The meter security data items are particularly implemented for use with the programmer-reader unit. If consecutive communications with the meter between different dates, indicate that the security data at the later date does not match the security data of the earlier, the meter has been communicated with by unauthorized persons.

The Table II of the external RAM 46 indicates the separate data items stored therein with the associated mnemonic. The description of the data item includes the coded format thereof and the number of bits forming the code in RAM 46. As noted above, each of the addressable RAM memory words of four bits require several RAM memory word locations for some of the data items. As shown in FIG. 1 the eight data lines of the I/O port PO of control circuit 46 are connected to the eight address lines of the RAM 46. The strobe and read/write logic inputs are connected to two of the data lines of the I/O port P1. The four I/O data lines of the RAM 46 are connected to the first four data lines of the I/O port PO to provide the unique data memory connection to the microprocessor CPU of the circuit 46. The memory is addressed and the coded values of the data items are transferred through the eight PO data lines. The data items are tabulated in Table II as follows.

TABLE II

EXTERNAL RAM DATA
Four Bit (D4–D0) by 256 Word Memory

| DATA IEM | MNE-MONIC | DATA DESCRIPTION |
| --- | --- | --- |
| 1 | SCNT | Seconds Counter-Six bit binary counter, counts down from 60 to 0 at 1 count per second rate. |
| 2 | MCNT | Minutes Counter-Six bit binary counter, counts down from 60 to 0 at 1 count per minute. |
| 3 | HCNT | Hour Counter-Five bit binary counter, counts down from 24 (starting at 12:00 midnight) to 0. |
| 4 | MP | Pulse initiator constant-1 bit binary constant. Set to 0 for MP = 2 (two pulses per disc rev.). Set to 1 for MP = 4. |
| 5 | YR 1 | Day of Year 1-2 BCD digits for the day of the year counter. |
| 6 | YR 2 | Day of Year 2-One half a BCD digit for the hundreds digit of day of year. |
| 7 | LP 0,1 | Leap year counter-2 bit binary counter. Counts a 4 year cycle with 00 indicating leap year. |
| 8 | DOWK | Day-of-week counter-three bit binary counter, counts down from 7 (Sunday) to zero. |
| 9 | PLSFLG | Pulse Initiator Flag-Bit indicates status of the pulse initiator inputs. |
| 10 | PIBIT | Pulse Initiator Flag-Bit indicates status of the pulse initiator output. |
| 11 | DAY CHG. | Day Change Flag-Status Bit is set to 1 when clock time changes from 11:59:59 pm to 12:00:00 midnight. |
| 12 | 7/365 | Calendar Flag-Control Bit which determines calendar cycle. When set to 1, the register repeats a 7 day cycle. When set to 0, it runs on a 365/366 day, 4 year cycle. |
| 13 | DSTS | Daylight Savings Time Set-Status bit which is set to 1 at midnight of DST start day and reset at 2:00 a.m. when actual DST adjustment is made. |
| 14 | DSTR | Daylight Savings Time Reset-Status bit serving similar function as described |

TABLE II-continued
EXTERNAL RAM DATA
Four Bit (D4-D0) by 256 Word Memory

| DATA IEM | MNEMONIC | DATA DESCRIPTION |
|---|---|---|
| | | for DSTS except used when going from DST to standard time. |
| 15 | HLDY | Holiday-Status bit, set to a 1 at midnight of start of holiday as defined in data table. Bit is reset to zero at the end of the day. |
| 16 | SUM/WIN | Summer-Winter-Status bit, set to 1 at the start of the "summer" rate schedule season and reset to zero at the start of the "winter" season. |
| 17 | HADR | Holiday Address-8 bit address which points to the RAM location of the next holiday, DST change or season change to be encountered. |
| 18 | DPFLG | Bits are control flags to enable the display for a given quantity. A 0 bit inhibits the display and a 1 enables. The flag bits are: Day of Year (DAYR) Total KWH (TKWH) Peak KWH (PKWH) Shoulder KWH (SKWH) Base KWH (BKWH) Peak KWD (PKWD) Shoulder KWD (SKWD) Base KWD (BKWD) |
| 19 | RPKWD | Maximum KWD, Peak Rate-Represents the maximum KW demand metered during the peak rate periods but subsequent to the last external reset operation. BCD format: $10^{-2}$ digit, $10^{-1}$ digit, Unit's digit, Ten's digit, Hundred's digit. |
| 20 | RSKWD | Maximum KWD, Shoulder Rate-Similar to RPKWD except applies to shoulder rate periods. |
| 21 | RBKWD | Maximum KWD, Base Rate-Similar to RPKWD except applies to base rate periods. |
| 22 | RTKWH | Total KWH-Represents the cumulative KWH registered by the meter. BCD format: Unit's digit, Ten's digit, Hundred's digit, $10^3$ digit, $10^4$ digit. |
| 23 | RPKWH | Peak Rate KWH-Similar to RTKWH except cumulative KWH consumption is during the peak rate periods only. |
| 24 | RSKWH | Shoulder Rate KWH-Similar to RTKWH except KWH consumption is during shoulder rate periods. |
| 25 | RBKWH | Base Rate KWH-Similar to RTKWH except KWH consumption is during the base rate periods. |
| 26 | CPKWD | Cumulative KWD, Peak Rate-Cumulative KW demand metered during the peak rate periods. Format is similar to RPKWD. |
| 27 | CSKWD | Cumulative KWD, Shoulder Rate-Similar to CPKWD except metered during the shoulder rate periods. |
| 28 | CBKWD | Cumulative KWD, Base Rate-Similar to CPKWD except metered during the base rate periods. |
| 29 | TDINT | Time of Demand Interval-This is an 8 bit counter which represents the elapsed time in the current demand interval. It counts down in 1 minute increments. |
| 30 | INTDEM | Current Interval Demand-This represents the demand accumulated during the current interval. It is reset at the end of each demand interval. The format is similar to RPKWD. |

TABLE II-continued
EXTERNAL RAM DATA
Four Bit (D4-D0) by 256 Word Memory

| DATA IEM | MNE-MONIC | DATA DESCRIPTION |
|---|---|---|
| 31 | TKWH | Fractional KWH-This is a 20 bit binary count which represents the pulses counted but which do not equal a full KWH. |
| 32 | TKWD | Fractional KW Demand-This is a 20 bit binary count which represents the pulses counted but which do not equal a full 1/100 of a kilowatt. |
| 33 | BTLOG | Battery Use Log-Represents the elapsed time which the unit has operated on battery power. This is a 20 bit binary number. Each count equals 4 seconds of battery operation. |
| 34 | LDCR | Load Control-Control bit for the load control function. This is programmed to a 1 if the relay is to be used as a load control output relay. |
| 35 | MIN CHG. | Minute Change-Flag bit is set when SCNT counts down to zero or when the register is accessed by the Programmer Reader. The next pass through the main program updates the minutes count and clears this bit. |
| 36 | PIFLG | Pulse Initiator Flag-Control bit for the pulse initiator function. This is programmed to a 1 if the relay is to be used as a pulse output. |
| 37 | NCODE | New Code (Security)-This is a "random" BCD number which is generated by the register each time it is read. It may be used to detect tampering. |
| 38 | OCODE | Old Code (Security)-This is the binary word from the NCODE location above which is moved to the OCODE location each time any register value is changed (including time and date). |
| 39 | TORSP | Top, Rate Switch Points-This is an 8 bit address which points to the external RAM location which contains the first word of the rate switch point table. |
| 40 | TPADR | Top, Address, Date Table-This is an 8 bit address which points to the external RAM location which contains the first word of the date table. |
| 41 | RIDC | Rate Identification Code-This is a 4 bit BCD number assigned to a given set of rate schedule data. |
| 42 | MIDC | Meter Constant Identification Code-This is a 4 bit BCD number assigned to a given set of meter constant data. |
| 43 | METID | Meter Identification-This is a 9 digit BCD constant assigned to uniquely identify a given register. |
| 44 | XFMR | Transformer Ratio-This is a 7 digit BCD constant which represents the metering transformer ratio used with a given register. The register KW and KWH readings are multiplied by this value to obtain primary readings. |
| 45 | KE | Meter KWH Constant-This is the constant which the register uses (together with the multiplier defined by KWHM) to convert input pulses to KWH readings. KE is stored as a negative, 12 bit, binary integer. |
| 46 | KWHM | Meter KWH Constant Multiplier-This is a 4 bit binary number which points to the decimal multipler for KE as follows: |

| KWHM | Multiplier |
|---|---|
| 0 | 10 |
| 3 | 100 |
| 6 | 1000 |
| 9 | 10000 |
| 12 | 100000 |
| 15 | 1000000 |

TABLE II-continued
EXTERNAL RAM DATA
Four Bit (D4–D0) by 256 Word Memory

| DATA ITEM | MNEMONIC | DATA DESCRIPTION |
|---|---|---|
| 47 | DINT | Demand Interval-This is a constant which sets the time period or length of the demand interval. It is an 8 bit binary number. |
| 48 | KD | Meter KWD Constant-This is analagous to the KE constant and is used to convert pulses to KWD readings. |
| 49 | KWDM | Meter KWD Constant Multiplier-This analagous to the KWHM multiplier except it is applied to the KD value. |
| 50 | CHKSM | Check Sum-This is a check sum consisting of two hex digits, used to verify the meter constants. |
| 51 | RATE SWITCH POINTS AND | Remainder of RAM-The remainder of the RAM locations are used as a buffer for storing rate switch point data and dates. There are 120 four bit words available and the buffer can be made up |
| 52 | DATE CODES | of any combination of switch points (4 words each) and dates (3 words each). The format for these items is specified below. The starting address for the switch points is defined by TORSP and the dates start at the location specified in TPADR. |

Rate Switch Points - 4 words each.
Switch points for each type of day are arranged in chronological order in contiguous location of RAM.
    Type of Day code:
        00 = Weekday
        01 = Saturday
        10 = Sunday
        11 = Holiday
    Load Control bit:
        0 = off
        1 = on
    Season
        0 = Season 0
        1 = Season 1
    Unused (set to 0)
    Rate Code:
        00 = Base
        01 = Shoulder
        10 = Peak
        11 = (Unused)
    Hour Code:
        The five bits specify the hour of the day the rate switch is to occur counting down (in binary) from 24 to 0.
    Minutes Code:
        These four bits specify the number of minutes after the hour when the rate switch is to occur. It is a binary number which counts down from 60 to 0 in 5 minute increments.
Date or Holiday Coding - 3 words each.
Note: Dates must be arranged in chronological order in contiguous locations of the RAM:
    Word 0 -
        Four bit BCD digit representing the LSD of the day of year.
    Word 1 -
        Four bit BCD digit representing the ten's digit of the day of the year.
    Word 2 -
        Two bit binary digit representing the hundred's digit of the day of the year.
    Word 3 -
        Day code (defines the significance of the date):
            00 = Holiday date
            01 = DST Set Date
            10 = DST Reset Date
            11 = Season Change Date The Table II above includes the data items TKWH and TKWD as the fractional KWH and KWD registers. The metering pulses from the converter 80 each represent a KWH/pulse and KWD/pulse value as noted above. These values are determined from the KE and KD and KWHM and KWDM data items in accordance with the following explanation.

The following quantities are defined:

Ke is the kilowatthour-per-pulse value of the meter-pulse initiator combinations:

$$K_e\left(\frac{kWhr}{pulse}\right) = K_h\left(\frac{Whr}{rev.}\right) \times M_p\left(\frac{rev.}{pulse}\right) \div 1000\left(\frac{Whr}{kWh}\right)$$

KE is the value of Ke expressed as a negative, 3 digit integer with the decimal point placed to the right of the least significant digit.

KWHM is the pointer for the multiplier. It is chosen to satisfy the equation:

$$Ke = KE \div (KWHM)$$

where KWHM is the multiplier pointed to.

TKWH is the fractional KWH reading stored in the register. It represents the pulses accumulated but which are less than 1 full KWH.

Kd is the kilowatt-per-pulse value of the meter-pulse initiator-combination:

$$K_d\left(\frac{KWD}{pulse}\right) = K_h\left(\frac{Whr}{rev.}\right) \times M_p\left(\frac{rev.}{pulse}\right) \div T_i\left(\frac{hr}{interval}\right) \div 1000\left(\frac{Whr}{kWh}\right)$$

KD is the value of the KWD times 100 (because the read out is in 1/100 of a KWD) expressed as a negative, 3 digit integer with the decimal point placed to the right of the least significant digit.

KWDM is the pointer for the multiplier and is chosen to satisfy the equation:

$$Kd = KD \div KWDM$$

where KWDM is the multiplier pointed to.

TKWD is the fractional KWD reading stored in the register. It represents the pulse accumulated but less than 0.01 KWD.

Utilizing the above, the following are sample calculations for calculating the constants:

Type D4S single phase watthour meter having 7.2 Kh, ½ Mp and 15 minute demand interval.

The following are then calculated:

$$Ke = \frac{7.2 \times .5}{1000} = .0036 \frac{KWH}{pulse}$$

KE set to =036 (FDC$_{16}$)
KWHM set to 9 (points to 10,000)

$$KD = \frac{7.2 \times .5}{.25 \times 1000} = .0144 \text{ KWD/pulse}$$

Since the demand display shows 0.01 KWD, the Kd constant is multipled by $10^2$ giving 1.44 display digits/pulse.

KD set to −144 (F70$_{16}$). KWHM set to 3 (points to 100).

The following are sample calculations for the readings:

When reading the meter, all KWH register locations (except for TKWH) obtained readings in KWH so no conversion is required. The TKWH location contains the fractional value of KWH in binary. This is converted to KWH as follows: Assume the location contains 1900$_{16}$. This converts to 6400 decimal. Then:

$$\text{Fractional KWH} = \frac{KWHM - TKWH}{KWHM} = \frac{10,000 - 6400}{10,000} = .036_{KWH}$$

where KWHM is the multiplier indicated by the pointer in the KWHM location.

The KWD register locations (except for TKWD) store directly in KW × 10$^{-2}$ units. The TKWD is converted as follows. Assume 36$_{16}$ is read from TKWD. Then:

$$\text{Fractional KWD} = \frac{KWDM - TKWD}{KWDM \times 100} = \frac{100 - 54}{10,000} = .0046 \text{ KW}$$

where KWDM is the multiplier indicated by the pointer in the KWHM register location.

The above illustrates how the fractional KWH and KWD registers TKWH and TKWD are initially coded with binary values equal to one kilowatthour and one one-hundredths kilowatt. The KWH/pulse and KWD/pulse values are known from the above so the metering pulses decrement the TKWH and TKWD registers until the one KWH and 0.01 KW values are reached. Plus or minus remainders are left in these registers so that no fractional measuring pulse value is lost. The appropriate multirate KWH and KWD registers and the cumulative KWH and KWD registers are incremented by a one KWH and 0.01 KWD BCD value, respectively.

Figure 3:
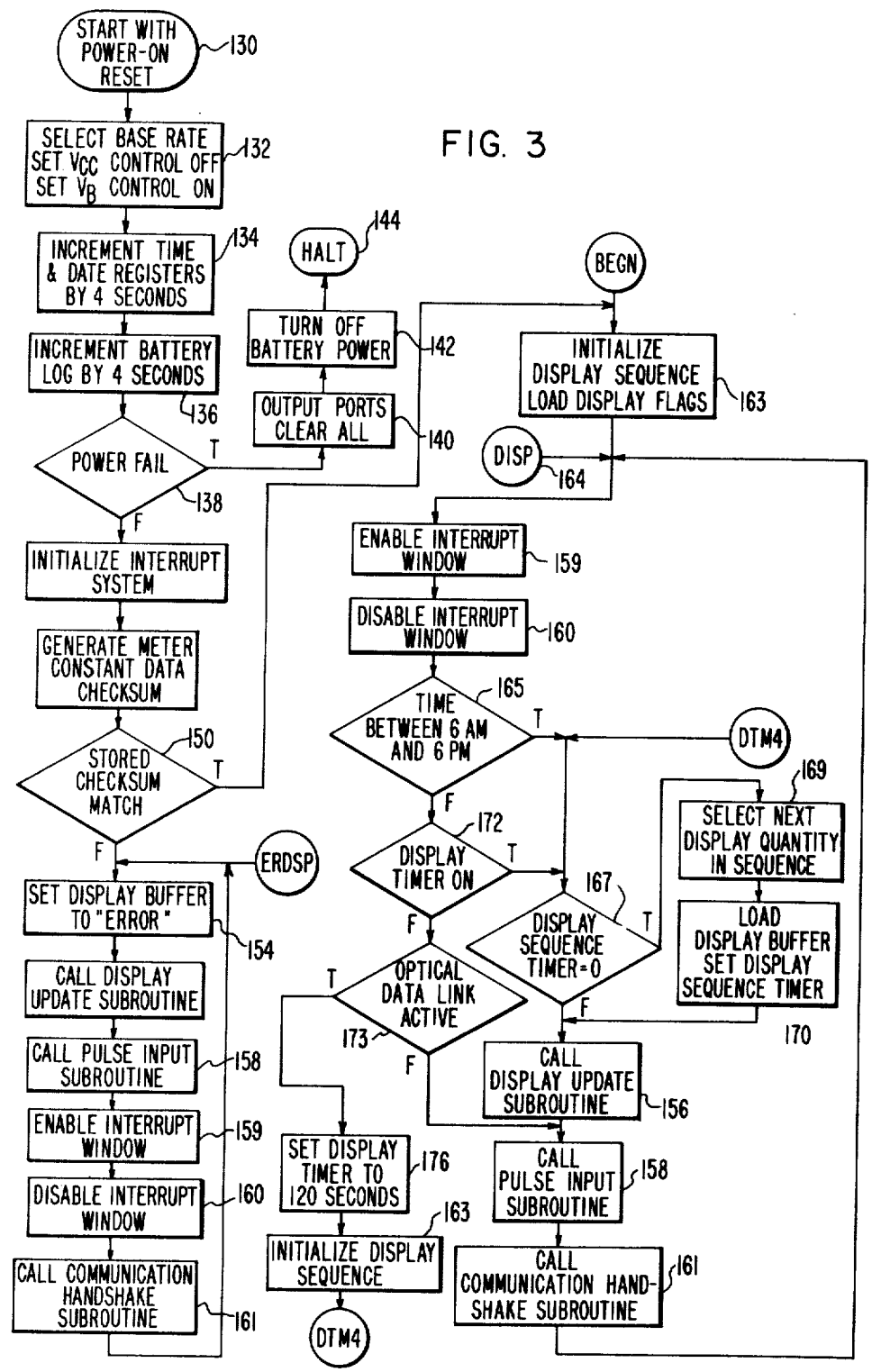
FIG. 3 is a main program loop flow chart diagram of the sequence operation of the meter shown in FIGS. 1 and 2.

The main program loop flow chart shown in FIG. 3 shows one preferred sequence of operation of the meter 30 shown in FIG. 1 having the metering data and alterable program control data shown in FIG. 2 and specified in the Tables I and II. The sequence of steps shown in FIG. 3 are called for in accordance with the program sequence control code of ROM 36. The entry 130 begins with power on reset initiated by the subsystem 50. During a power outage the operation 132 effects battery power operation and since the auxiliary timing signals are at a four second rate, the time and date registers SCNT, MCNT, HCNT etc. are updated at a four second rate indicated by operation 134. The battery log timer counter register BTLOG is increased by four seconds at operation 136. The decision 138 tests if power fail logic from subsystem 50 is still true and if true, the operations 140 and 142 power down the system to the HALT exit 144. The battery power is turned off to all but the critical low power CMOS circuits including the RAM 46 and a timer oscillator in the subsystem 50.

If decision 138 is false the microprocessor interrupt system is initialized at operation 146 and the operation 148 performs a checksum check by placing the meter constants values in the control logic 34 and determining if the value calculated therein is equal to the data item CHKSM stored in RAM 46 at decision 150. The true and false paths of decision 150 go to the labels 151 BEGN and ERDSP 152, respectively.

Figure 5:
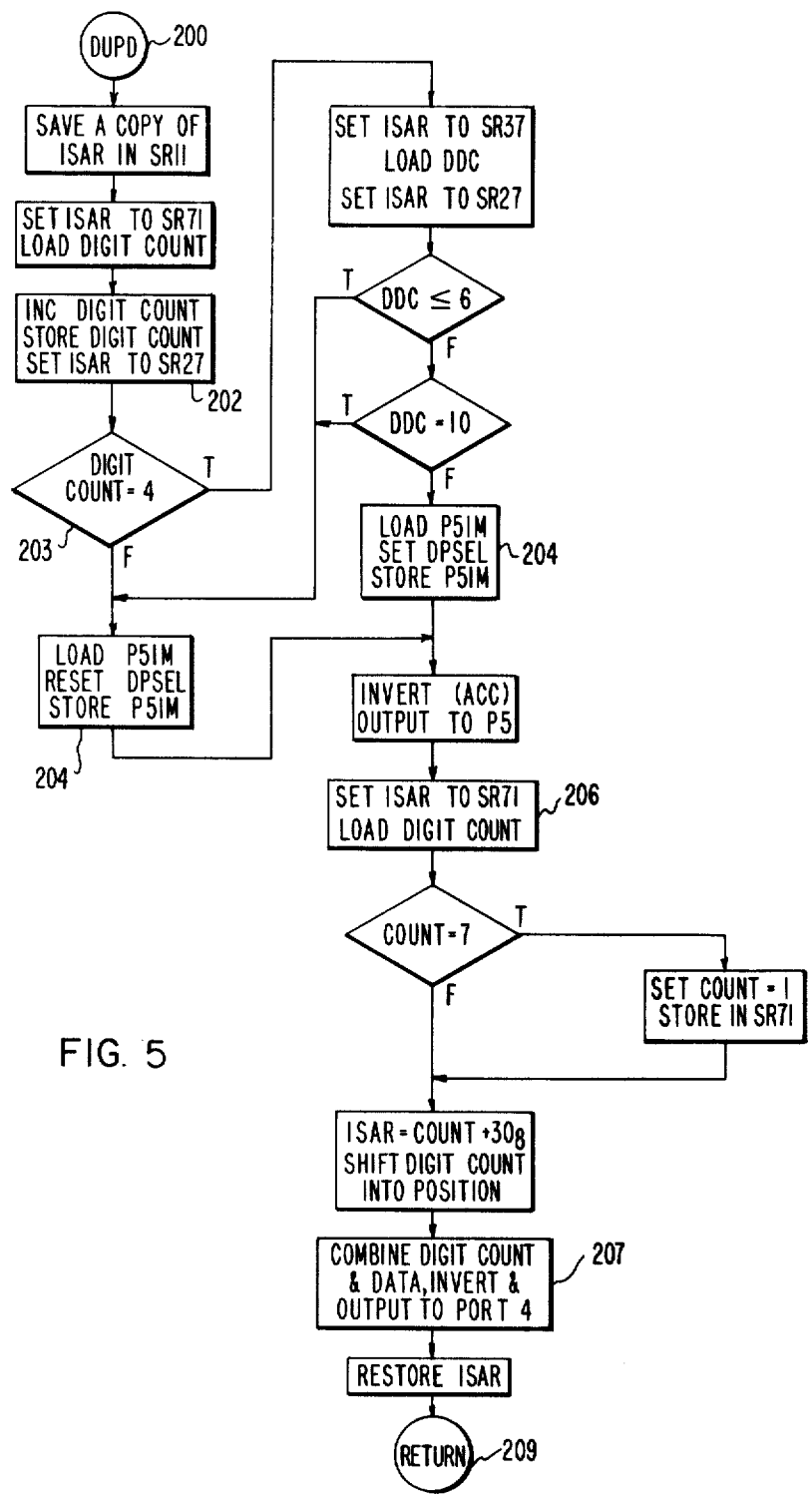
FIG. 5 shows a flow chart of a display update subroutine.
Figure 6:
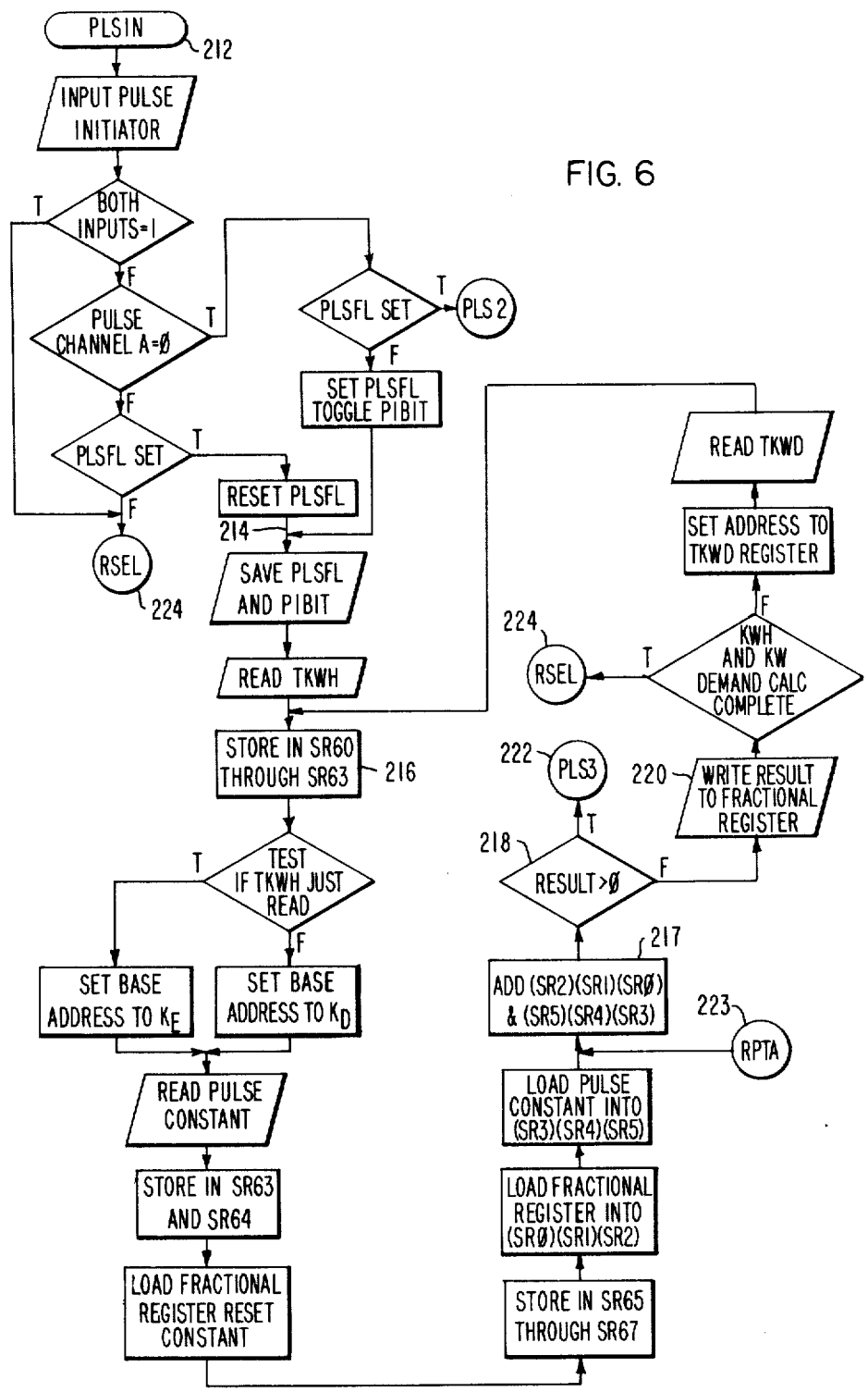
FIG. 6 shows a flow chart of a pulse input subroutine.
Figure 7:
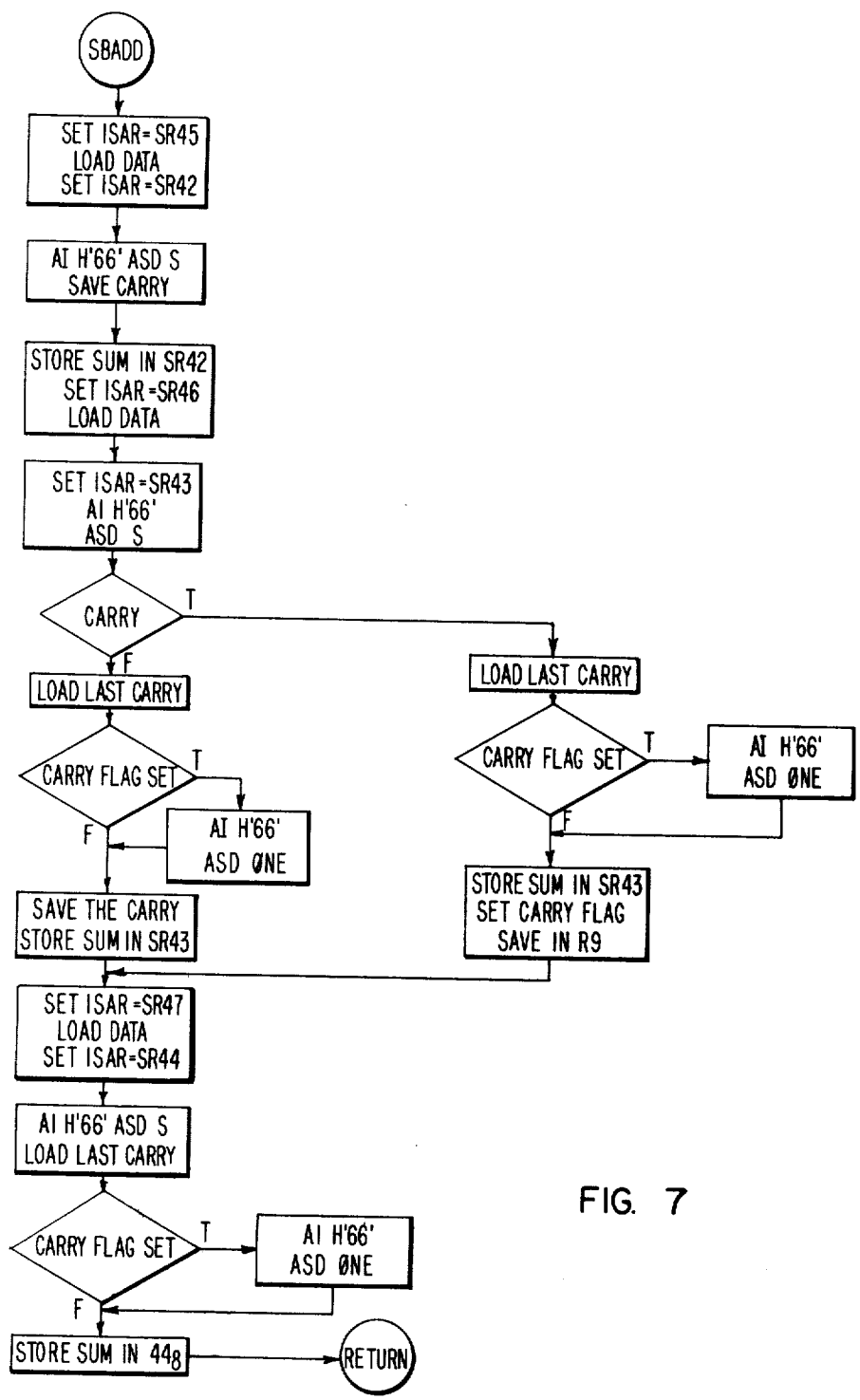
FIG. 7 shows a flow chart of a binary add subroutine.

At label 152 the display buffer is set to display "Error", since the checksum was incorrect, at operation 154. The display buffer is the register area SR30-SR37 of scratchpad register 38 having data items controlling outputting to port P5 including DPFLG, DSPID, DIG5-DIG1, DDC, and DSTM. The outputs of circuits 92 and 93 of FIG. 1 are set to produce "Error" at five digits of display 90. The display update subroutine DUPD, described further hereinbelow in connection with the description of FIG. 5, is called at operation 156 to output the "Error" display. The pulse input subroutine PLSIN, shown in FIG. 6, is called at operation 158 for receiving the metering pulse inputs and updating the KWH and KWD accumulating registers, check the rate selection tables, check the pulse initiator/load control output, and check the date code table as described further hereinbelow. The operations 159 and 160 call for the timer interrupt TINT subroutine shown in FIG. 4 for processing the one second time base time signals to update the time and date registers in RAM 46. The operation 161 calls for the communication handshake subroutine for communicating with a programmer-reader unit through a data link established at the interface 104. Thus, although the error condition is noted and displayed, the metering and time updating operations continue as the loop continues from operation 161 to the label 152. A programmer-reader unit must follow to interrogate the meter and determine the cause of the error condition.

Figure 16:
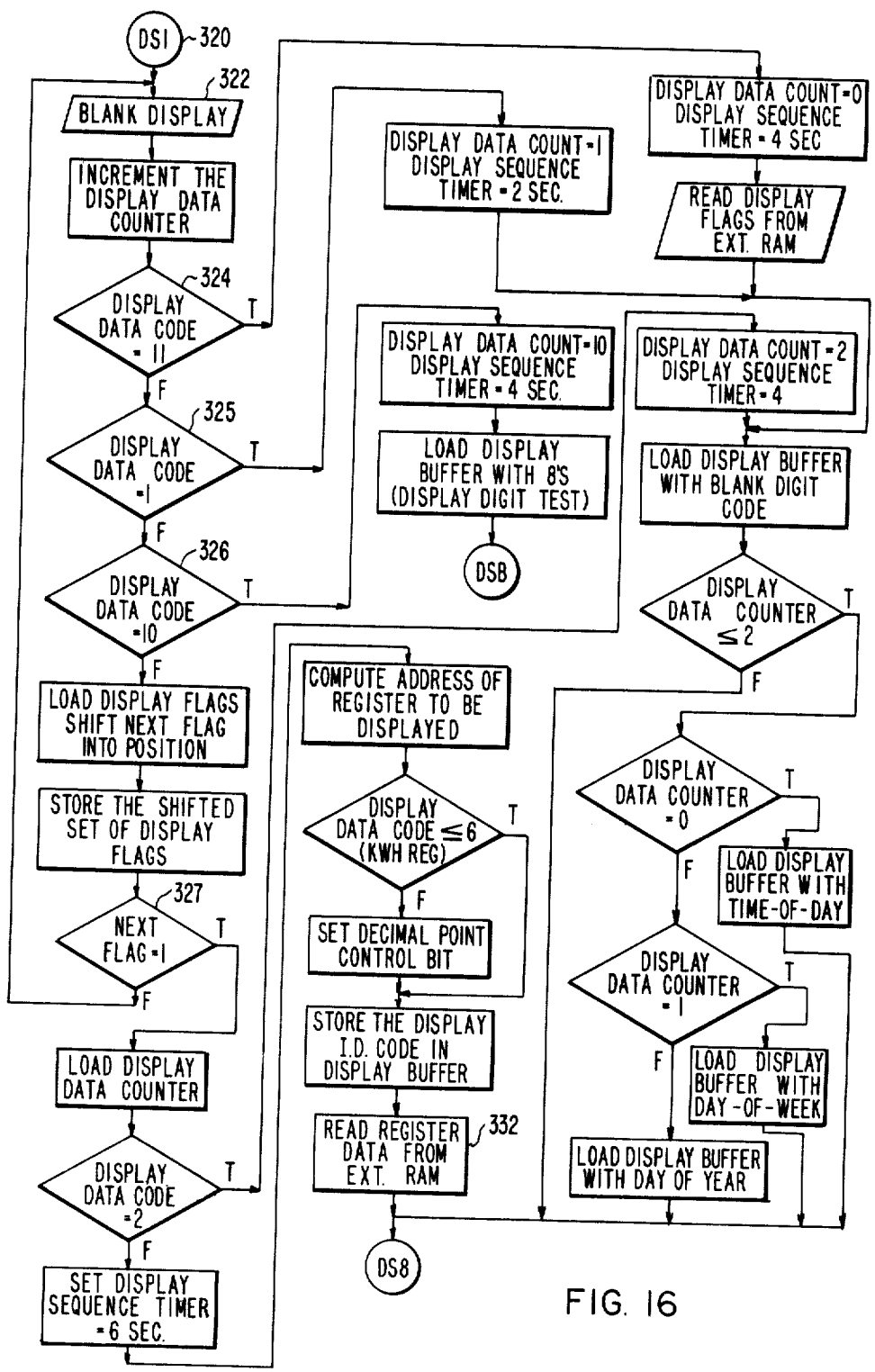
FIG. 16 shows a flow chart of a display select subroutine.

If the decision 150 is true in FIG. 3, the operation 163 calls for the initializing display sequence subroutine to prepare for displaying the different displayed quantities including the coded data values of the multirate KWH and KWD and time and date data. The display flags are loaded from PLSFLG in RAM 46 to register SR30 in scratchpad register 38. The label 164 is noted as the point in the flow chart where the program loop will normally recycle during normal multi-functional metering operation. The operations 159 and 160 call for operation of the TINT subroutine of FIG. 4. The decision 165 checks to see if the real time is between 6 a.m. and 6 p.m. or the daytime period when the display is turned on and if the real time is during the nighttime the display is turned off. If decision 165 is true the label DTM4 at 166 is reached as is decision 167 to see if the display timer counter at SR37 is equal to zero, as determined in the control logic ALU34, meaning that the end of the time to display a given quantity has been reached. If true, the operations 169 and 170 call up a new quantity to be displayed at the display 90 and the display timer counter register 38 DSTM SR37 in the scratchpad register is set to control the length of time that the next data quantity will be displayed. The quantities are displayed in the sequence that the displayed data quantities are designated in the display data counter DDC in the register SR37 which counts time by the timer interrupts. The aforementioned subroutine is shown in FIG. 16. The false result of decision 167 and the end of the operation 170 go to the operations 156, 158 and 161 noted above. When the decision 165 is false the decision 172 checks if the display timer DSTM is still on and if true the display 90 can finish reading out the quantity being displayed. If decision 172 is false the decision 173 checks the inputs 106 and 107 of the interface 104 to see if they are being activated by light, as from a flashlight. If decision 173 is false the operations 158 and 161 follow and if true the display operation is initialized at operations 176 and 163 to provide readout at the display 90 by light activating the inputs to the interface 104 even though the time is from 6 p.m. to 6 a.m. The above described general sequence of operation provides all the modes of operation of the meter 30. The following described flow chart diagrams are subroutines contained in the sequence of operations shown in FIG. 3.

FIGS. 4 through 16 are flow chart diagrams of subroutines of the various metering operations. In order to disclose the various operations in a concise manner, they are made so as to relate the separate operations to the data items and register address locations of RAM 46 and the scratchpad register 38, respectively. Thus, each of the operations and decision points are not described separately since the legends within the flow chart symbol blocks define the operative logical or computational step thereat and/or the mnemonic for identifying the data item or memory location and/or the data item being processed. The data items including control flags are set forth in the above Tables I and II. The instructions effecting execution of the different operations are generally in the order as shown beginning with the top of each subroutine flow chart diagram and sequentially progressing therefrom in accordance to the program instructions of ROM 36.

Figure 4:
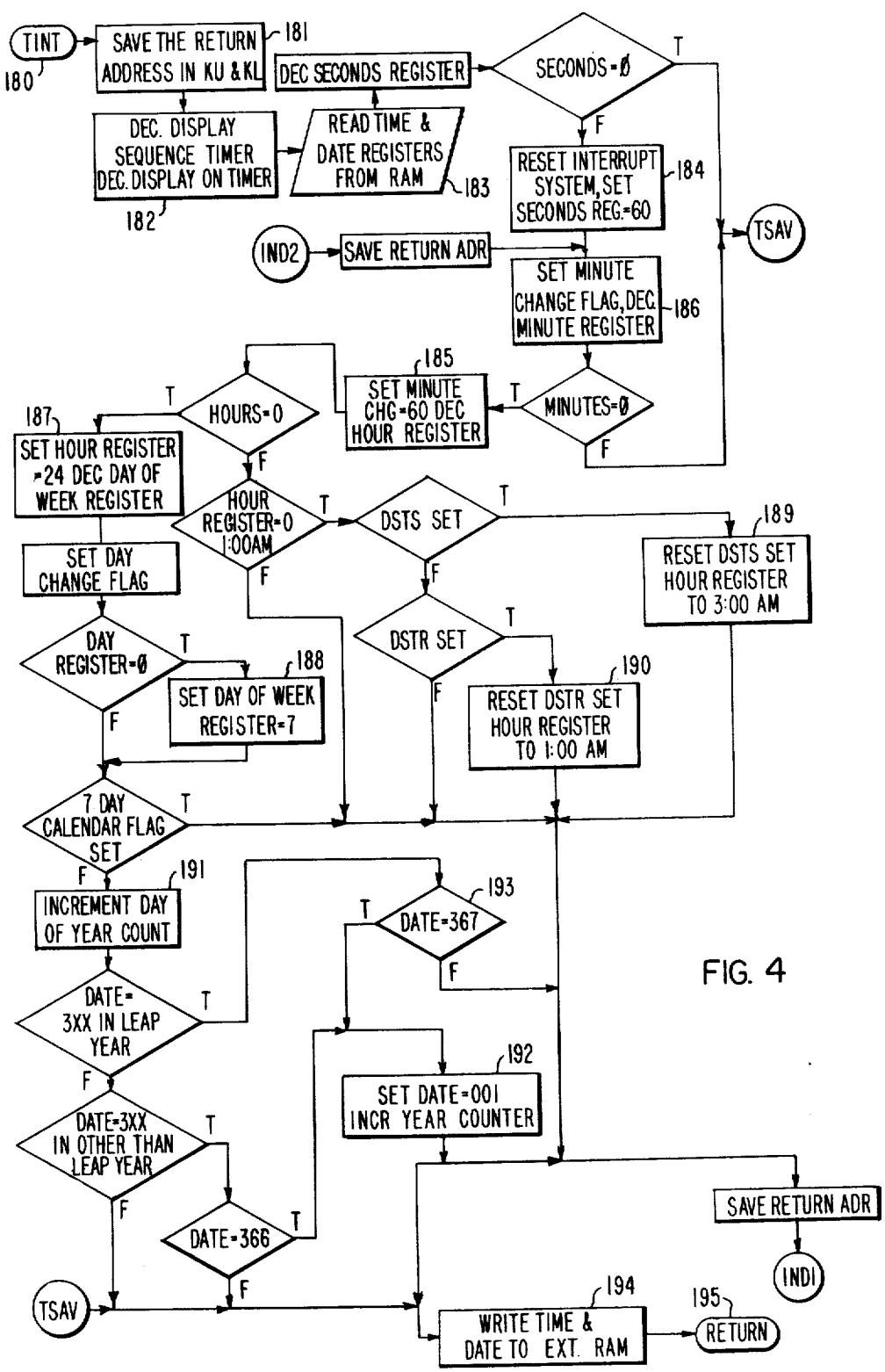
FIG. 4 shows a flow chart of a timer interrupt subroutine.

FIG. 4 shows the timer interrupt subroutine labeled TINT which is called at the enable interrupt window operation 159 of FIG. 3. The entry 180 is activated in response to receiving a one second base timing signal which is processed by the control logic 34. The scratchpad registers are initialized at operation 181 and the display sequence counter DSTM in scratchpad register SR37 is decremented by one second at operation 182 after having been set to a count of either 2, 4 or 6 seconds in accordance with the displayed quantity. A display and timer counter is provided in the scratchpad register 38 that provides for a maximum time period on the order of two minutes after it is activated by simultaneous optical inputs to the data link sensors 106 and 107. It is decremented at the one second time intervals also. The operation 183 reads the RAM time and date registers into the scratchpad register 38. The seconds and minutes registers SCNT and MCNT are set to sixty if they zero when decremented, as shown at operations 184 and 186. The minute change flag in FLR 1 data is set at operation 186. The hours register HCNT is set to twenty-four, as at operation 187 and then decremented with each complete hour. The day of the week counter register DCNT is set to "7" (Sunday) at operation 188 and decremented each twenty-four hours. The operations 189 and 190 effect the real time clock changes for time changes due to daylight savings time changes. The day of the year counter register YR1 and YR2 is incremented at operation 191. The number of days of the year are counted beginning with January first corresponding to day one started at operation 192. The decision 193 is to accommodate leap years having an additional day. After all of the time and date registers have been updated in the scratchpad registers the data items are placed back in the corresponding memory registers of RAM 46 at operation 194 and the TINT subroutine exits at 195.

The FIG. 5 illustrates the display update DUPD subroutine to output one entry from the display buffer (SR registers 31 through 37) to the correct digit on the display 90 and then adjust the counter registers in the display buffer in preparation for the next digit. The digits of the display 90 are multiplexed at a high frequency rate, as the steps of the main program loop are performed, so as not to be discernible by visual observation. The display digit count of register SR71 designates the existing display digit being activated to display the appropriate data in the contents of the scratchpad display buffer display digit registers SR31 and SR32 through SR36 (DSPID and DIG5 through DIG1). The subroutine is entered at DUPD label 200 and the contents of SR71 are fetched and then incremented at operation 202. The decision 203 is to determine if the digit count is four where the display quantities of KWD include a decimal point with the displayed numerical data. Which quantity is being displayed is determined from the display data counter DDC in SR37. The ten displayed quantities are listed in Table I at the DSPID data item at SR31. If appropriate the DPSEL flag is set at P5IM at operation 204 and the subroutine progresses to output to the display 90. The operation 206 determines what the count is which must be between one and six since six digits are used to display time and date and the KWH and KWD metering data along with the display indicator ID code. The operation 207 causes output of the numerical data for the designated digit. The return label 209 returns to the main program loop of flow chart shown in FIG. 3.

In FIG. 6 there is shown the pulse input PLSIN subroutine for processing the two metering pulses A and B input at register 42, port P1 at the operation 158 in FIG. 3. These pulses are converted to KWH and KWD BCD coded measuring values and thereafter the rate selection, demand timer and demand reset, pulse initiator/load control, and date code table check operations are performed. At the entry 212 of the pulse input routine PLSIN the first operation is to input the metering pulses into the control logic ALU 34. The logic performed by the sequence control code of ROM 36 and the control logic ALU 34 is such to find if the pulse initiator inputs have changed from the last sampling. This is accomplished in the area of the flow chart diagram between PLSIN and the junction 214. The subroutine includes a comparison of the pulse initiator input status with the current saved copy of the metering pulse input flag, which is stored in the RAM 46 at the data item PLSFLG. Using that flag bit in comparison with the state of the inputs, the program determines whether or not the meter disc, not shown, has rotated to the next spot. If the disc has rotated, then the subroutine proceeds to convert this next pulse for inputting into kilowatthours or kilowatts demand measuring values. The initial part of the subroutine prevents the same spot of a meter disc repeatedly sending metering pulses due to disc "jitter". The operation causing the pulse initiator control bit (PIBIT) to toggle each time pulse input flag bit PLSFL is set, has the effect of a divide by two on the input pulse train formed by processing metering pulses A and B. This allows the relay switch 74, when used as a pulse initiator input to a data recorder, to provide a pulse repetition frequency that is within the recording limits of the recorder without requiring external counters.

Figure 8:
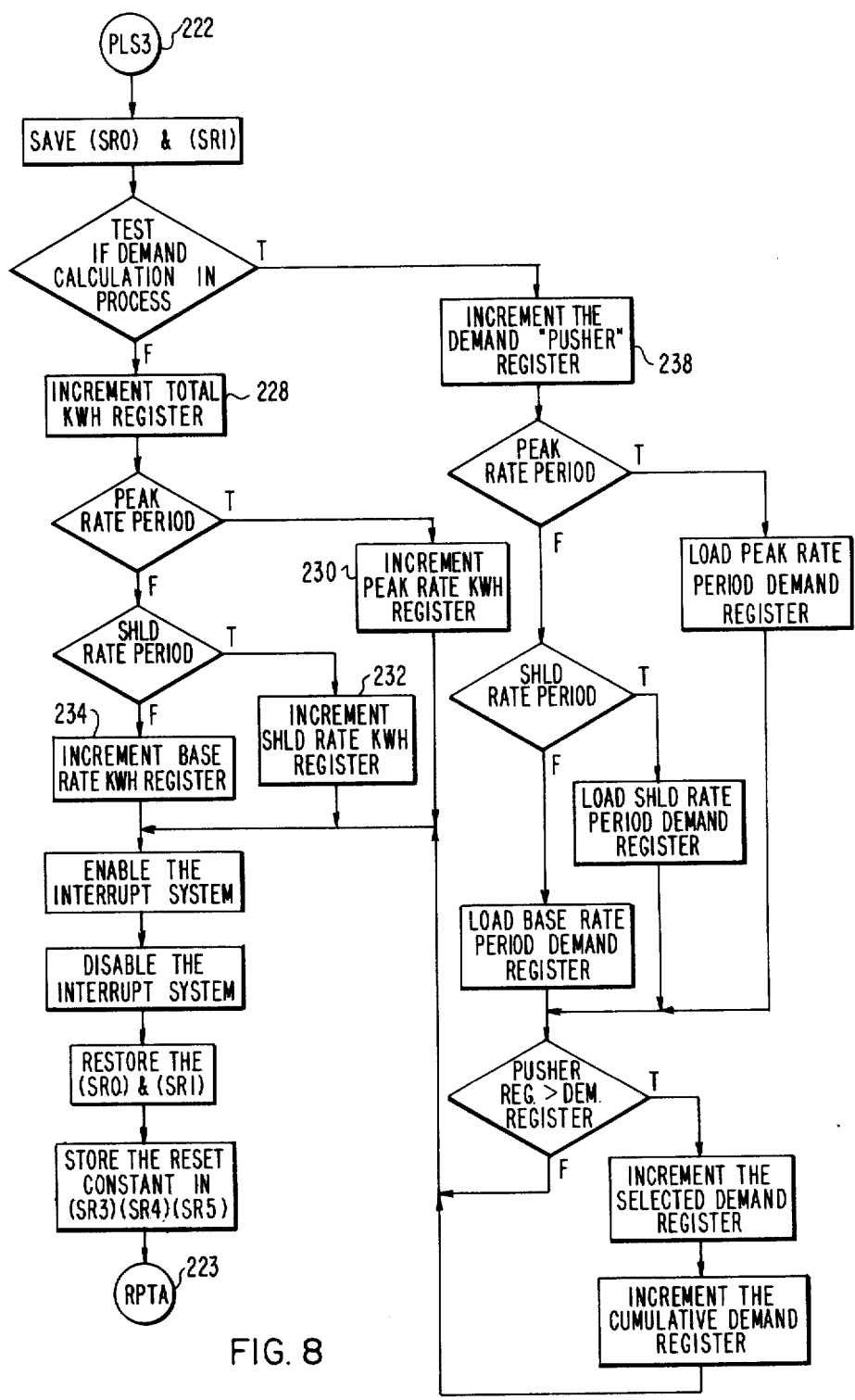
FIG. 8 shows a flow chart which illustrates the continuation of the pulse input subroutine.
Figure 9:
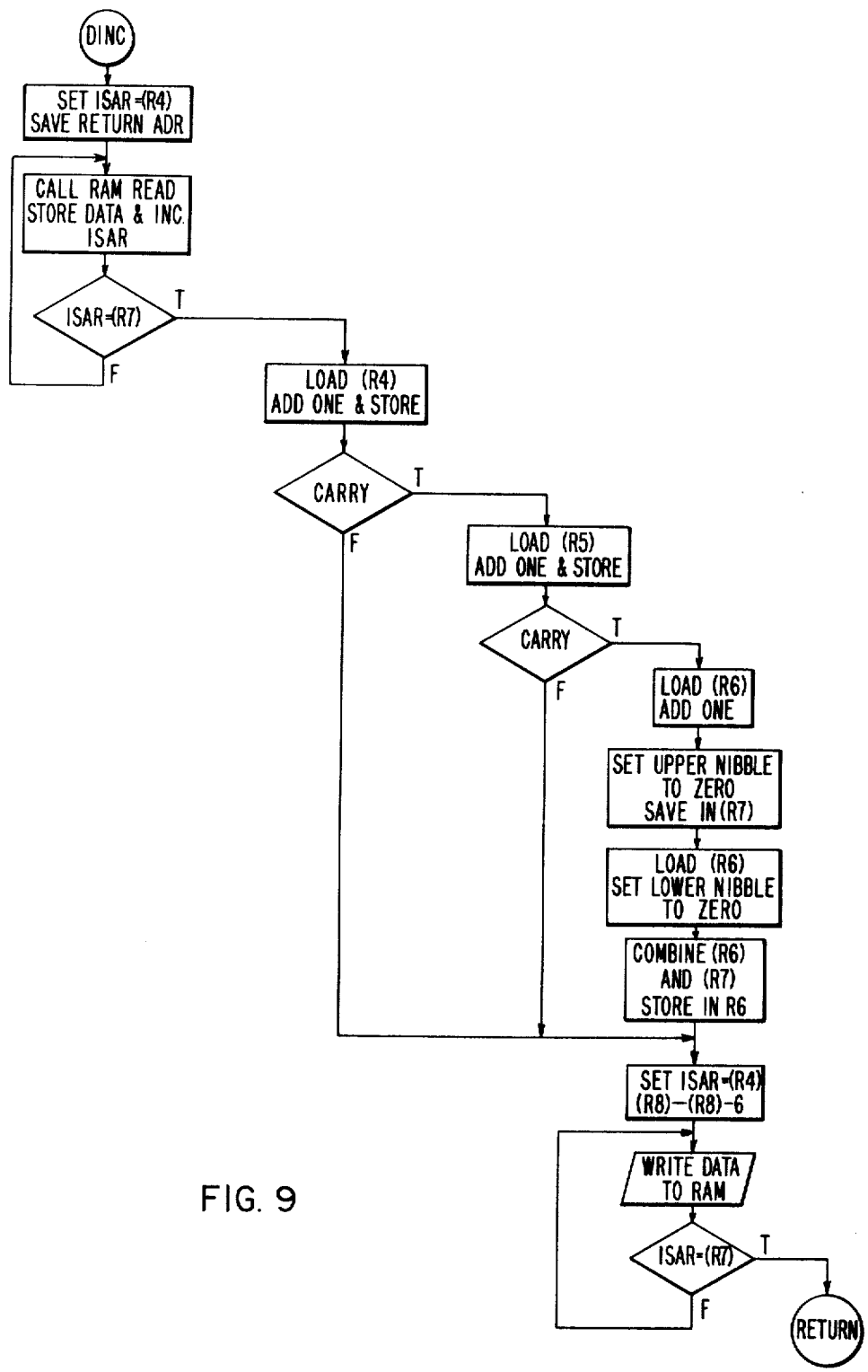
FIG. 9 shows a flow chart of a decimal increment subroutine.

The sequence control code of ROM 36 causes the fractional kilowatthour register TKWH to be loaded into the scratchpad register 38 in FIG. 2 by bringing it from RAM 46 into the general purpose accumulator ACC 45 and from there storing it in scratchpad registers SR60-SR62 indicated at operation 216. The value of Kd is read in from the RAM 46 and through the general purpose accumulator ACC 45 and stored in scratchpad register 38 at SR63-SR64. Kd is then subtracted from the fractional kilowatthour register TKWH. This is done by loading the various values from the scratchpad register 38 into the general purpose accumulator ACC 45 and performing binary subtraction. The binary subtraction is performed at operation 217 in accordance with the SBADD subroutine shown in FIG. 7. The result of the subtraction will be either positive, zero or negative. If the result is negative, a false output occurs from decision 218 meaning that there has not been one full kilowatthour of registration with this last pulse. A large number of pulses, a minimum of sixty nine pulses per kilowatthour are required. When the result is negative then there has not been one full kilowatthour of accumulation so the fractional kilowatthour register value is decremented by the measuring amount of one pulse in kilowatthours. The later operation 220 occurs from the scratchpad register 38 to the general purpose accumulator ACC 45 and is then placed back in the fractional kilowatthour register TKWH of RAM 46 waiting for the next metering pulse to arrive. If the result of the subtraction at operation 217 is zero or positive, the true decision 218 indicates to the control logic ALU 34 that there has been now enough pulses accumulated to register one additional kilowatthour in the appropriate multirate and cumulative KWH registers. The label PLS3 at 222 is the beginning of the continuation of the instant PLSIN subroutine and is shown in FIG. 8. The label 223 of RPTA occurs at the end of the entry PLS 3 in FIG. 8. The operation 217 is provided by the BCD addition subroutine SBADD shown in FIG. 7 as noted above. The add subroutine is shown for converting the BCD values to binary codes for arithmetic subtraction using two's complement arithmetic performed in the control logic ALU 34. The results are converted back to BCD coded values for storage in the appropriate registers in RAM 46. The label 224 indicating the rate select subroutine RSEL shown in FIG. 6 is described with respect to the subroutine illustrated in FIG. 10.

The FIG. 6 subroutine progresses from the true output of decision 218 to the subroutine shown in FIG. 8 beginning with the PLS3 label 222. After initial checks, the sequence control code in ROM 36 causes the control logic 34 to input from RAM 46 the total kilowatthour register RTKWH. The RTKWH register is loaded into scratchpad register 38, under control of the sequence control code, so that the RTKWH register is incremented by one and then it is put back into RAM 46 into its memory location with the value incremented by one kilowatthour. The incrementing of the metering values of the registers is done at the incrementing operations such as at 228 by the DINC subroutine shown in FIG. 9.

Next in the sequence of FIG. 8, the ROM sequence control causes the port 5 image register at register SR27 to be loaded and a determination is made as to which time differentiated rate category embraces the current time. Based upon the decision as to which billing rate is in effect, the ROM control code causes the control logic 34 to again interface with RAM 46 and read in the appropriate KWH register, either peak RPKWH, shoulder rate RSKWH, or base rate RBKWH. The register incrementing processes at operations 230, 232, or 234 are such to maintain the count of total kilowatthour register RTKWH as always equal to the sum of the three time differential multirate KWH registers. These values are actual accumulated KWH values as a function of billing rate times. The subroutine of FIG. 8 returns to RPTA label 223 to totalize the appropriate KWD registers.

To process the metering pulses for accumulating KWD, the fractional kilowatt demand register TKWD is read from the RAM 46 through the general purpose accumulator ACC 45 and stored in the scratchpad register 38 again under the control of ROM sequence control code. The value of Kd as defined above is read in and the subtraction process occurs using the SBADD subroutine of FIG. 7. The result of the subtraction determines whether the appropriate time differentiated multirate demand register is to be incremented or not. Beginning at the operation 238 the KWD values are added to the appropriate one of the KWD registers. The register INTDEM in RAM 46 is also referred to as the "pusher register" since it is reset at the end of the demand interval time in accordance with the count of the register TDINT.

Figure 10:
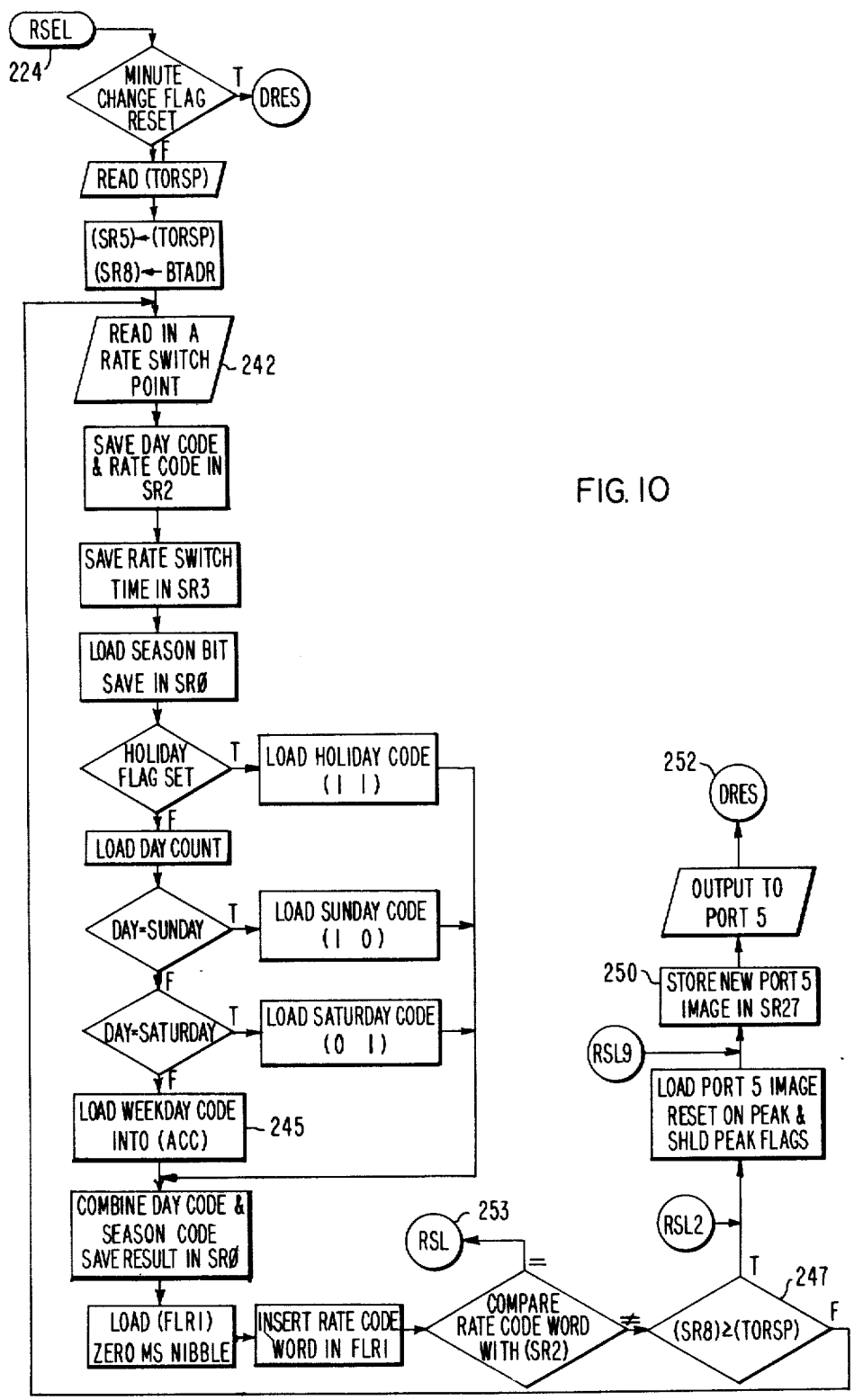
FIG. 10 shows a flow chart of a rate select subroutine.

The sequence control code of ROM 36 effects entry to the rate select subroutine RSEL shown in FIG. 10 as a part of the PLSIN subroutine of FIG. 6. The rate select subroutine is effective to once each minute scan the table of coded entries for rate schedules in the RAM 46. These are defined as the rates switch control points 1 through N in FIG. 2. The purpose of this subroutine is to scan to see if it can find a match between the time of day, day of the week, and the type of day—such as a holiday, weekday, Saturday or Sunday. If a match is found between the current time registers in RAM 46 and a rate switch control point then this indicates to the control logic 34 that it should take the rate information stored at that rate switch control point and change the KWH and KWD multirate registers to receive the measuring according to whatever parameter is stored there. This effects the change from base rate to shoulder rate, or shoulder rate to peak rate, and the like as instructed by the coded data of the rate switch control point. The coded format of each of the 1 through N rate switch control point codes is described hereinabove. It is noted that these memory codes are sequentially stored in RAM 46.

The subroutine RSEL is entered at 224 and the TORSP data is called, which is pointing to the top or end of the rate switch point stack. This is an address which defines the boundary between the rate switch control points and the date code or day of the year code table, stored in consecutive locations in the RAM 46. This boundary is needed because the 120 memory words of RAM 46 for rate schedules can be divided between rate switch control point codes and day of the year codes. After knowing where the top of the table is, the bottom memory location is fixed as always beginning at a certain location. The BTADR is defined as the bottom address for rate selection. The subroutine then reads in a rate switch control point code and starts to "build" a current status reference date based upon the current time and date registers, and a current yearly date code. The rate switch control point is read in at operation 242 in FIG. 10. The S/W season flag is checked first and then a holiday date is looked for by checking the holiday flag. If it is a holiday, the appropriate holiday code is loaded; if it is not a holiday, the day counter DOWK is loaded. A check is then made to see if the day of the week is Sunday, if so a Sunday code is loaded. A check is then made to see if it is a Saturday and if it is a Saturday, the appropriate code for a Saturday is loaded. If all of these tests fail then the day of the week is a weekday—Monday through Friday. The appropriate code is loaded into the accumulator ACC 45 for the weekday at operation 245. The day code is combined with the season code and thus is saved in SR0. At this point, the FLG 1 register is loaded from scratchpad memory and the current status reference code, just "built" is entered. This current status reference code distinguishes what season is currently in effect and what rate category the current day is in. The status reference code just built is compared against the rate switch control point code which was read in from the sequential schedule of rate switch control point codes. If there is no match and comparison is not equal, then the control logic 34 compares the address which it is looking or which it is using to access the rate switch control points. This is stored in scratchpad register SR8. The contents of SR8 are compared against the top of the rate switch point, TORSP, at decision 247 to see if the routine has reached the top or end of the rate switch control point codes. If it has not reached the top of the rate switch control points, the control logic 34 causes it to go back to the point in the sequence control ROM 36 where it reads in the next rate switch control point and proceeds to execute the same series of instructions as described above again looking for a match. Thus, the complete series of rate switch control points (from 1 to N in FIG. 2 each having the same format) are searched until a match is found.

If the program sequence goes completely through the table or schedule of rate switch control points without finding a match, then the routine will simply exit causing the rate indication bits in the port 5 image to be set at base rate at operation 250. This is a default situation for rate selection. If there is no exact match with a particular type of day, such as a holiday or a Sunday then the routine will automatically go to the base rate condition. The demand reset DRES subroutine label 252 is then reached. If during the table search a match is found between a stored rate switch control point and the current status reference rate code, which is built by the checking of the current season and day, then the program control is transferred to the RSL label 253.

Figure 11:
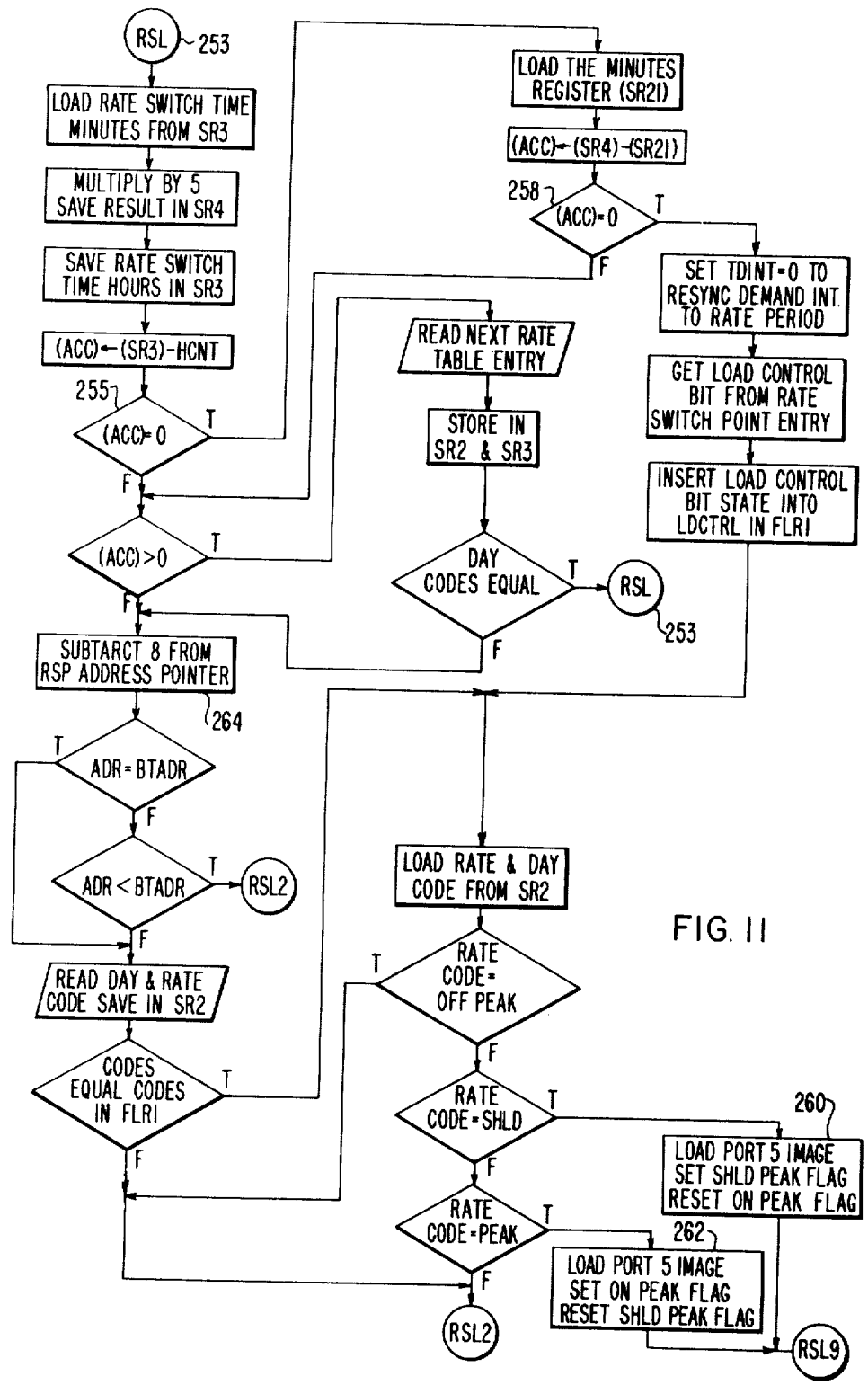
FIG. 11 shows a flow chart which illustrates the continuation of the rate select subroutine.

The function of the RSL subroutine beginning at label 253 in FIG. 11 is to compare the current real time with stored rate switch control point times which are coded in hours and twelve, five minute intervals. As noted in Table II the hour time is coded in the five bits designating midnight as a count of 24 and being counted down or decremented thereafter. The minutes are coded in four bits having a maximum count of twelve representing the twelve, five minute increments of each sixty minutes of an hour which if the first decision 255 is true in FIG. 11 and the accumulator ACC 45 result is zero, the current time in hours matches the rate switch point code in hours. Then the current minutes count is compared to the rate switch point minutes code by a subtraction operation in the control logic 34. If there is an equality again and decision 258 is true, the program will then take the code stored in the rate switch control point indicating what rate period should be selected in this moment and time. The bits in P5 image will be changed to the appropriate code and output to I/O register P5 to the peak rate alert control or shoulder rate alert control output lines causing the indicator lights on the meter and the associated relay to be activated according to the coded rate bit states of the switch control point. The foregoing is indicated at operations 260 and 262.

If there is not an exact match found with a rate switch control point in the subroutine of FIG. 11 a program search is made through the coded rate switch times just prior to the one that is being compared and the rate switch control time after the time it is comparing. These are the rate switch control points in RAM 46 having times compared against the current clock time. If the current clock time is between two rate switch times then to get to the present rate switch point in the instruction sequence there must have been a match of the day. The subroutine program searches to find that it is bracketed by two rate switch control point times. If there is a match of the day and the season code in the next rate switch control point in the table, the match being the same one that it is looking at in the previous entry, then the program goes back because a new rate switch point has not been reached for this particular type of day. The current billing rate is determined by going back to the previous rate switch control point entry. After the sequence passes a rate switch point then it is to stay on that particular rate until a new code is reached and then there is a switch over to a new billing rate category.

The following is an example of the rate selection operation beginning at midnight when a base rate is automatically set. The program searches for the current season and current type of day. The current time is assumed to be before a first rate switch point at 10 a.m., for example. At 10 a.m. a rate switch code indicates a shoulder rate but before that the program had been on the base rate. The next time the rate selection table is checked, it is assumed to be after a first daily rate change, for example 10:01 a.m. The next rate switch point to be performed is assumed to be 3 p.m. and a current time of 10:01 a.m. indicates that the second rate switch point in time has not been reached. The program then goes back to the entry for 10 a.m. and gets the shoulder rate selection code and outputs it to the register 44 and I/O port P5. The purpose of the operation 264 in FIG. 11 is to back up two code locations in the rate switch control point codes of RAM 46 and check to see if the program has gone past the bottom address BTADR. Thus, the subroutine program included in both FIGS. 10 and 11 passes through the rate selection schedule once each minute and either finds a rate switch control point match or does not so as to automatically default to a base rate.

Figure 12:
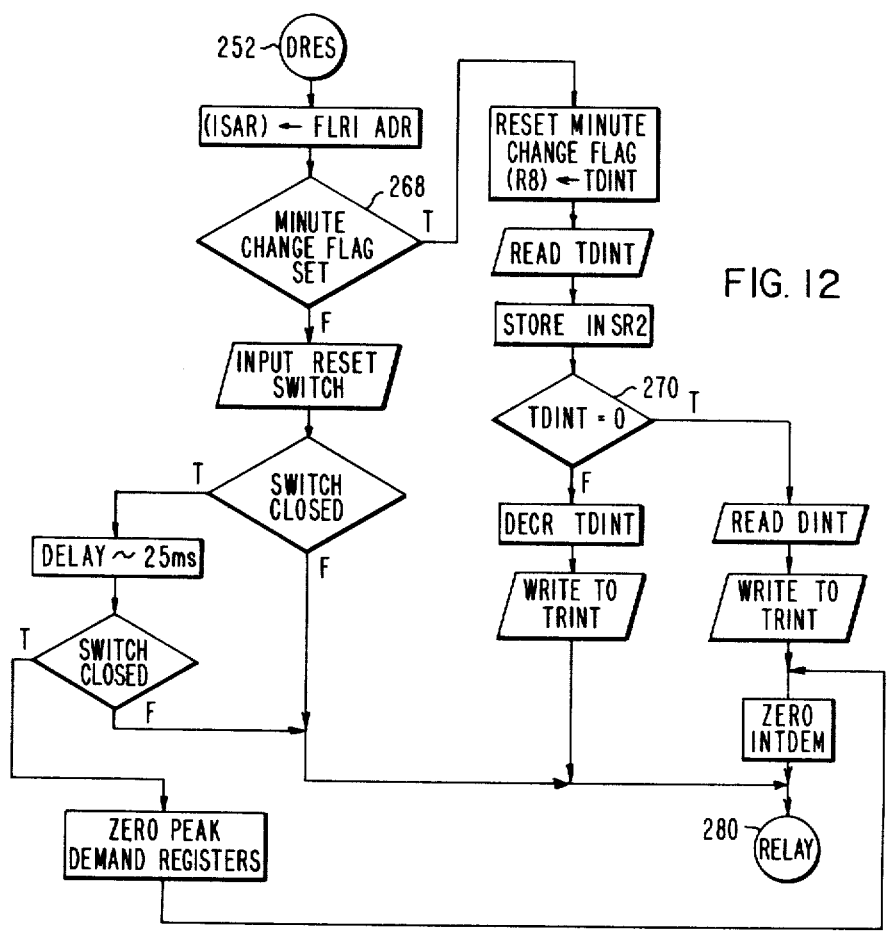
FIG. 12 shows a flow chart of a demand reset subroutine.

FIG. 12 is the demand reset DRES subroutine beginning at label 252 occurring at the end of the RSEL subroutine of FIG. 10. The demand interval time register TDINT is an eight bit binary counter which allows a demand interval from one minute to 255 minutes. When the timer interrupt has determined one minute has elapsed, a control bit is set called the minute change flag MIN CHG noted hereinabove. The demand reset subroutine is entered and it loads flag register 1 FLG 1 of SR 26. If the minute change flag MIN CHG is set then a true at the decision 268 branches to reset the minute change flag so that this occurrence or this sequence of code will not be executed again for another minute. The value of TDINT, which is the count of the temporary demand interval timer, is read from external RAM 46 and the value of TDINT is compared to zero TDINT which is at the end of the demand interval. Each minute the demand interval timer is decremented by one minute. If the demand interval timer reaches zero, then the decision 270 branches to read the value stored in the meter constant data memory area of RAM 46 to read the programmed demand interval time. This effects a reset of the demand interval timer and begins a new demand interval.

During the watt demand accumulation, the count of the demand pusher register, INTDEM, is compared against the current rate base, peak or shoulder peak demand register and if the current rate maximum demand register is less than the demand pusher then that maximum demand register is incremented as well as the cumulative demand register. With zeroing of INTDEM the subroutine of FIG. 12 is completed. If the decision block 270 is not equal to zero, the current demand interval is not finished so the demand interval timer TDINT is decremented by one. This new demand interval time is written back again to the value of the demand interval timer TDINT in the external RAM 46 and the subroutine is left. The decision 268 prevents anything occurring in the DRES subroutine until a minute change time occurs even though this subroutine may be entered many times between the minute change time.

Figure 13:
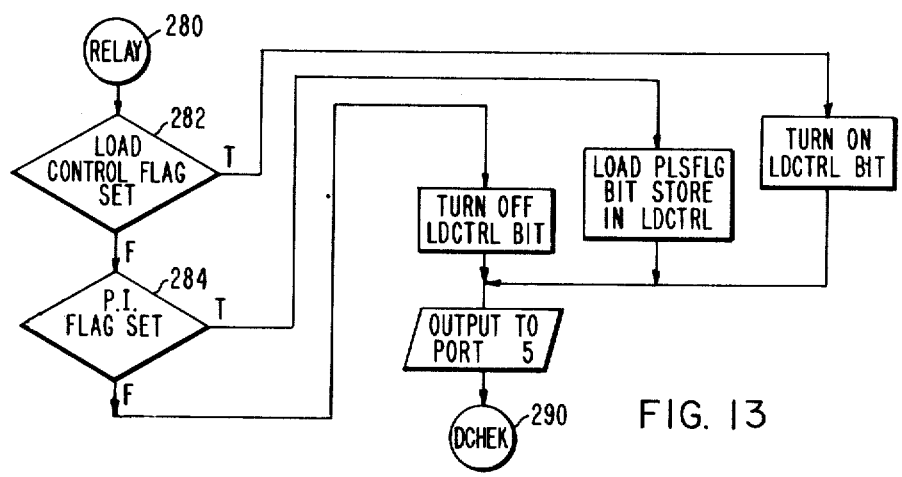
FIG. 13 shows a flow chart of a load control relay subroutine.

Referring now to FIG. 13, there is shown a load control relay subroutine beginning at the RELAY label 280. The control data line 56 of FIG. 1 is used as either a load control relay control or for a pulse initiator pulse output depending on the status of PIFLG in RAM 46. The status of each of pulse initiator flag and load control relay flag bits are stored in the register SR26. The decisions 282 and 284 determine whether the load control flag bit or the pulse initiator flag bit has been set. The flags control the output to the control data line 56. When the pulse initiator flag is set, the metering pulse outputs are effective to produce operation at the relay switch 74 for data recording. When the load control relay flag is set, the control logic 34 energizes the relay switch 74 for reducing power consumption of a load energized by control of the relay switch 74. The load control relay or relay switch remains energized until another rate switch control point is encountered in the program that indicates that it is to be deenergized. Thus, the load relay control can be made to cycle on and off at desired times of a predetermined billing rate period.

Figure 14:
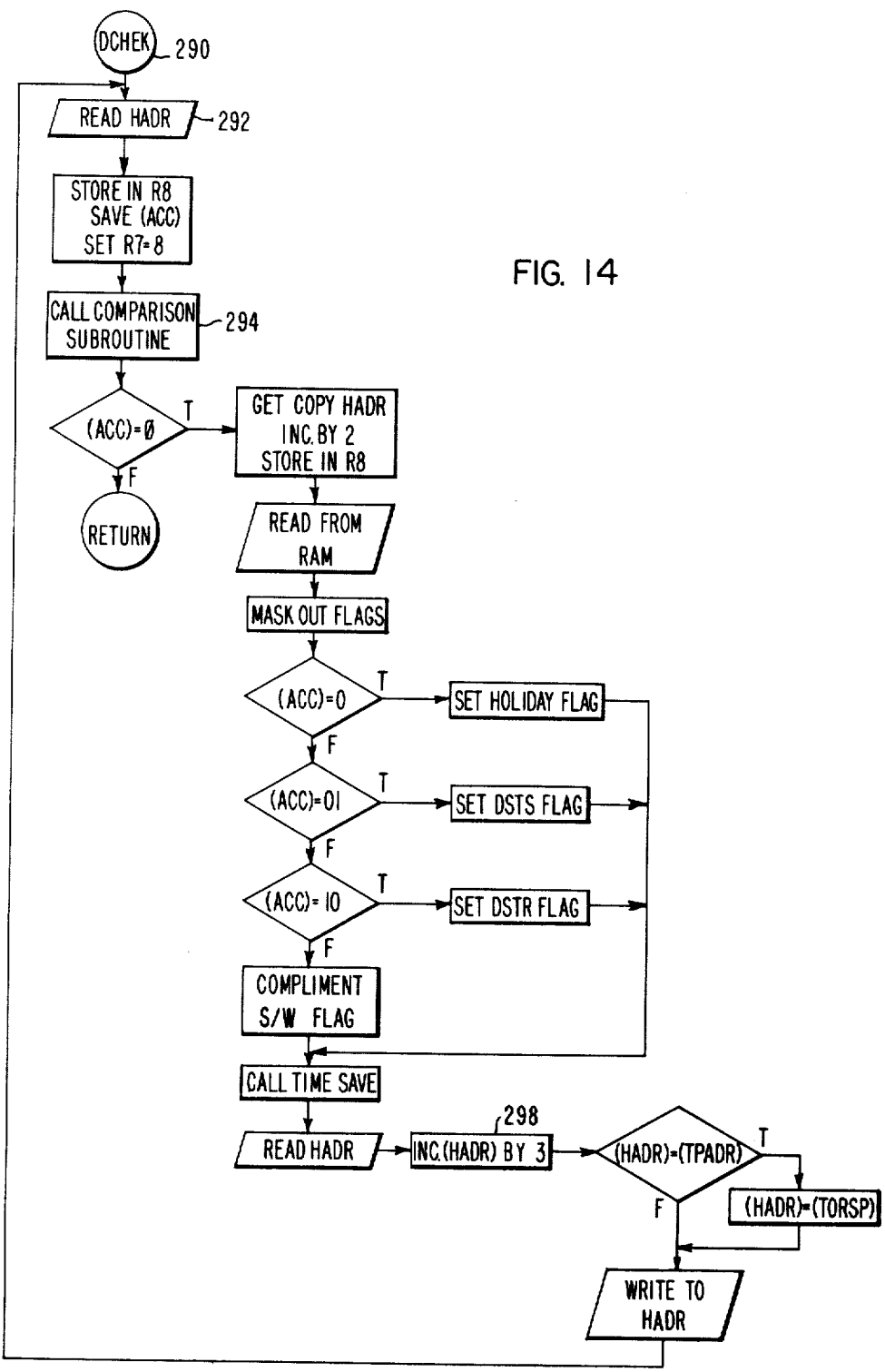
FIG. 14 shows a flow chart of a date check subroutine.

Referring now to FIG. 14 there is shown the day check DCHEK subroutine beginning at the label 290. The series of date codes follow the rate switch control point codes in the 120 word space of RAM 46 as noted hereinabove. The numerical day of the year is coded in the year units, tens and hundreds coded location with a day code indicating a holiday, day light savings time change date or seasonal change date. These are described in Table II hereinabove. The table of date codes is not completely searched each time like the rate switch control point codes are. When the meter 30 is initialized from a programmer reader unit, the next yearly date code date is set up following the current date and all the coded dates are stored in chronological order.

The first operation 292 is to read into the logic control 34 the HADR register from RAM 46 which is a holiday address pointer. The date code stored at the address contained in HADR is compared at operation 294 by a comparison subroutine, shown in FIG. 15, with the day of the year in the YR1 and YR2 registers RAM 46. If the results in the accumulator 45 are not 0, indicating that the rates do not match, then the program exits at label RETURN to the main program loop having completed the pulse input checks. If there is a match with the current yearly date, then the two bits of the associated day code are entered to set one of the holiday, DSTS, or DSTR flags in register SR 25 and if none of these are to be set then the complement of the S/W season flag is set. On the day light savings time change date the time in hours counter HCNT will be changed by one hour at 2:00 a.m. of that day as shown in the TINT subroutine of FIG. 4. The address in HADR will be replaced at operation 298 by the address of the location in RAM 46 containing the next date code. This is written back into RAM 46 at location HADR.

Figure 15:
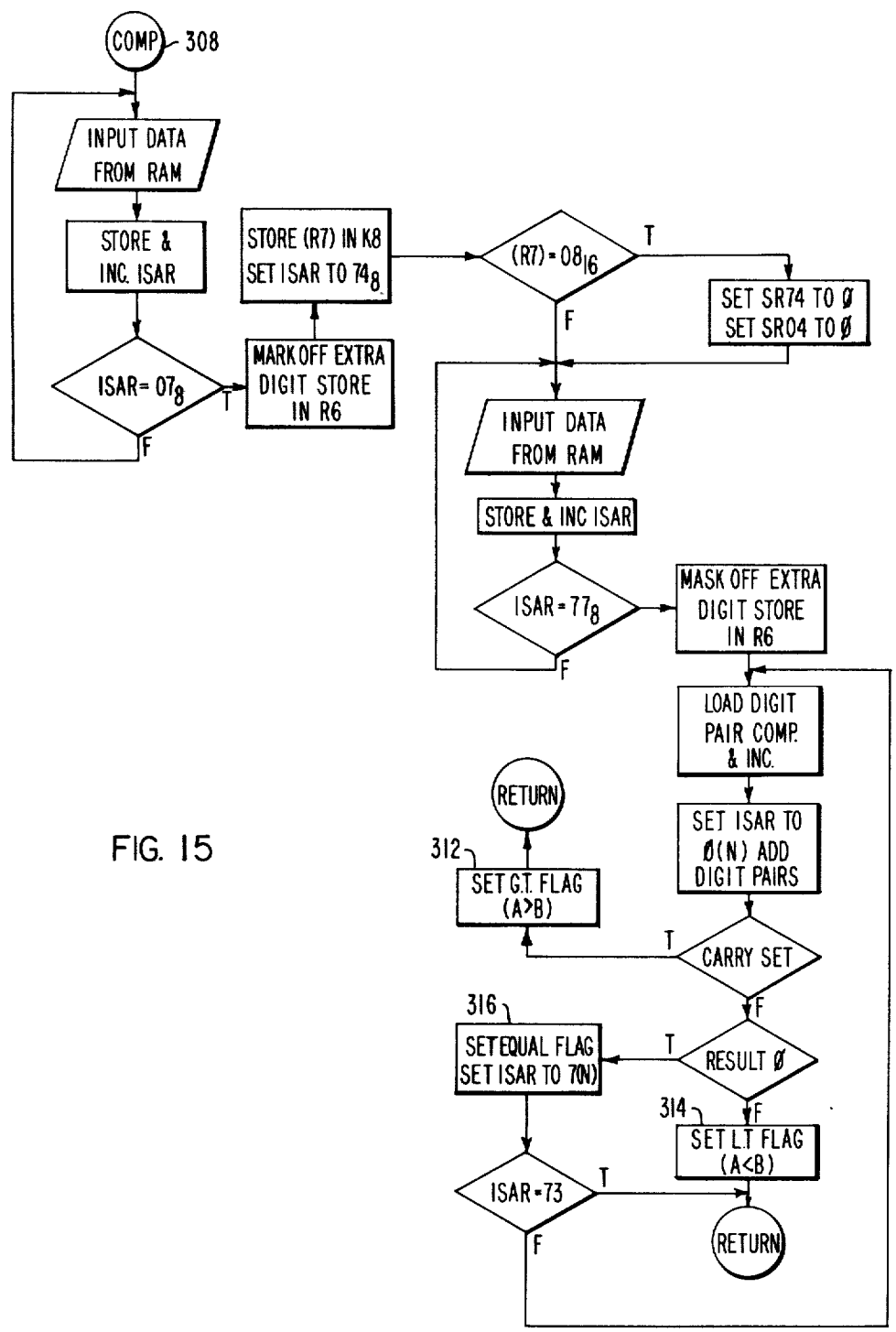
FIG. 15 shows a flow chart of a comparison subroutine.

Referring now to FIG. 15, a comparison subroutine starts at label at 308. The subroutine compares the demand pusher INTDEM register against the KWD register which is to be incremented for the current measuring or rate time. The subroutine further compares the current day of the year date with the yearly date stored in the date code. The compared data items are either twenty bit quantities in the case of demand registers or they are twelve bit quantities in the case of dates. The comparison subroutine brings in the two quantities to be compared by reading RAM 46 using starting addresses passed to the subroutine in SR7 and SR8. Greaer than, less than and equality results set corresponding flags at the operations 312, 314 and 316, respectively.

FIG. 16 illustrates the display select routine DS1 beginning at label 320 which is part of the main program loop of FIG. 3. The DS1 routine is included at operations 169 and 170. The DS1 routine uses the scratchpad buffer registers SR30 through SR37 to select display quantities in timed sequence. The eleven quantities that are displayed are listed in Table I under the DSPID register SR31 description. The list includes the corresponding indicator ID code, the number of readout digits used for the quantity readout at display 90, and the time interval that the quantity will be displayed in the sequential order shown. The DPFLG register SR30 includes the flag bits which must be set to one so that a corresponding quantity will be displayed. Thus, any of the eight quantities of DPFLG are optionally displayed. The four bits of the display data counter (DDC) of register SR37 have a binary count that corresponds to the display indicator ID of DSPID. As the count of DDC changes, the quantities being displayed are correspondingly changed. The different time intervals for display time of each quantity are controlled by the four bit count of the DSTM register SR37. The numerical value of each of the six display digits is stored as a four bit BCD code in the corresponding six registers SR31 through SR36. The numerical values displayed at the digits correspond to the coded values of the data items in the corresponding time and date registers, and multirate KWH and KWD registers in RAM 46. The first and leftmost digit of display 90 is always the display indicator ID code which is coded in register SR31. Either the one, three, four or five rightmost display elements provide readout of the display quantities. The display test is displayed as all "8's" in each of the eight display elements of display 90.

Referring further to FIG. 16, the subroutine is called for by the program sequence control code at the operation 169 in FIG. 3 if the display timer has counted to zero at DSTM register 37. The display is initially blanked at operation 322. The register DDC is incremented and then the data code of DDC is checked to see if it is eleven, to test if the end of display sequence is reached, or one or ten to go to the corresponding operations of the decisions 324, 325, 326. The display flags of the register DPFLG are processed by the control logic ALU45 and tested to determine if the next quantity in the display sequenced is to be passed or displayed. The quantity to be displayed is found in the DDC register and then the DSTM register is set for the corresponding display time interval. The appropriate display indicator ID code of the DSPID register is selected and the corresponding coded contents of the data items in RAM 46 are read in the control logic ALU45 at the operation 332. The appropriate ones of the display digit registers SR32 through SR36 are loaded with the coded values of the RAM data items. It is noted that the five digits of the KWH and KWD measured values of RAM 46 are stored in the corresponding five locations of the display digit registers SR32 through SR36. These data items are stored in a BDC format in the RAM registers.

The display quantity selected in the DS1 routine of FIG. 16 is processed on a digit by digit basis to the display elements of the display 90 as the main program is continuously sequenced. The display update DUPD subroutine shown in FIG. 5 produces the multiplexed digit displays as the operation passes through the main program loop shown in FIG. 3. The display quantity status remains at the display 90 for the predetermined time interval while the separate display digits are multiplexed. When the display sequence timer DSTM ends at count zero, the display time interval ends and the display select DS1 routine selects the next quantity to be displayed and the corresponding display time interval therefor.

The programmable time registering electric meter 30 as described above accumulates the real time and date data and processes the metering pulses to efficiently accumulate multirate KWH and KWD meter readings as separate time differentiated measured parameters of the flow of AC electric energy monitored for billing and electric energy control purposes as described hereinabove.

While a preferred form of the present invention is described hereinabove, obvious modifications and changes thereof may be made without departing from the spirt and scope of this invention as defined in the following claims:

I claim:

1. A time registering electric energy meter for measuring an AC electric energy quantity in response to time differentiated rates, said meter comprising:

means producing metering pulse signals at a rate responsive to said AC electric energy quantity to be measured;

means including first read-write memory means responsive to said metering pulse signals for accumulating variable coded values of one parameter of said AC electric energy quantity in separate ones of plural measuring data storage register means;

means producing regularly occurring timing signals;

means including second read-write memory means responsive to said timing signals for accumulating variable real time and date coded data in separate ones of plural storage register means, said plural storage register means including minutes, hours, day of the week and day of the year storage register means;

means including third read-write memory means for storing a plurality of fixed rate switch control point data codes in sequential ones of plural storage registers with each of said rate switch point data codes having identical data formats including encoded hour and encoded minutes data in time of day storage register means, an encoded one of a day of the week and a day of the year in a type of day storage register means and an encoded one of said time differentiated rates in a rate code storage register means; and control logic means for sequentially comparing at a predetermined rate of said timing signals the real time and date coded data of said second memory means with the stored rate switch point data codes in a sequential order of comparison being the same as the sequential order of the storage thereof in said third memory means, said control logic further including means responsive to matching of common time and date coded and encoded data of said second and third memory means for producing a current rate switch time logic state therein, said control logic means further including means responsive to said current rate switch time logic state to effect a change in the accumulation of said coded values of said one parameter from one to another of said measuring data storage register means such that said parameter is accumulated in response to the encoded time differentiated rate of the rate switch point data code producing the matched comparison of said second and third memory means.

2. The programmable time registering electric energy meter as claimed in claim 1 wherein said first memory means includes another measuring data storage register means for storing fractional values of a predetermined incrementally accumulated value of said parameter stored in said separate ones of plural measuring data storage register means, wherein said another measuring data storage register means incrementally accumulates the fractional values therein in response to each of said metering pulse signals.

3. The programmable time registering electric energy meter as claimed in claim 2 wherein said one parameter is watthours and further wherein said predetermined incrementally accumulated value is one unit of kilowatthours.

4. The programmable time registering electric energy meter as claimed in claim 3 wherein said time differentiated rates include high, mid and base rates and wherein said separate ones of plural measuring data storage register means includes at least three storage register means for incrementally accumulating the one unit value of kilowatthours in separate ones of the three storage register means in accordance with the high, mid and base time differentiated rates when said real time and date code data of said second memory means embraces one of three different current measuring time categories, respectively as defined by encoded rate codes of said third memory means.

5. The programmable time registering electric energy meter as claimed in claim 4 wherein said first memory means includes further separate ones of plural measuring data storage register means for accumulating variable coded values of another parameter of said AC electric energy quantity.

6. The programmable time registering electric energy meter as claimed in claim 5 wherein said first memory means includes still another measuring data storage register means for storing fractional values of a predetermined incrementally accumulated value of said another parameter to be stored in said further separate ones of plural measuring data storage register means, and wherein said still another measuring data storage register means incrementally accumulates the fractional values therein in response to each of said metering pulse signals.

7. The programmable time registering electric energy meter as claimed in claim 6 wherein said another parameter is watts and wherein said predetermined incrementally accumulated value thereof is one unit kilowatt demand.

8. The programmable time registering electric energy meter as claimed in claim 7 wherein said further separate ones of plural measuring data storage register means includes at least three storage registers for incrementally accumulating the one unit values of kilowatt demand in separate ones of the last-named three storage register means in accordance with the high, mid and base time differentiated rates when embracing said three different current measuring time categories, respectively.

9. The programmable time registering electric energy meter as claimed in claim 8 wherein said first memory means includes at least two still further plural measuring data storage means for incrementally accumulating cumulative values of said one unit of kilowatthour and one unit of kilowatt demand being fractionally stored in both of said another measuring data storage register means.

10. The programmable time registering electric energy meter as claimed in claim 9 including visual display means for sequentially displaying the three accumulated parameter values of both kilowatthours and kilowatt demand for each of said high, mid and base time differentiated rates and at least one of said cumulative values of kilowatthours and kilowatt demand.

11. The programmable time registering electric energy meter as claimed in claim 1 wherein said third memory means further stores a plurality of fixed date codes in sequential ones of plural storage registers with each of said date codes having identical data formats including an encoded day of the year in one associated storage register means thereof and an encoded day type in another associated storage register means thereof, and wherein said encoded day type of one of said date codes designates the yearly date at which the encoded day of the year of one of said rate switch point codes occurs.

12. The programmable time registering meter as claimed in claim 11 wherein said rate switch point data codes include encoded start of season times in either of two logic states in an associated season storage register means and wherein at least two of said date codes include encoded day types for designating two yearly dates where said two logic states switch from one logic state to the opposite logic state.

13. The programmable time registering meter of claim 12 including a fourth read-write memory means and wherein said metering pulse signals produce fractional values of said one unit of kilowatthours and one unit of kilowatt demand as determined by a kilowatthour per pulse constant Kd and a kilowatt demand per pulse constant Ke stored in data storage register means of said fourth memory means and wherein said fractional values of both of said another measuring data storage register means are effective to increment by said one unit values of kilowatthours and kilowatt demand in one of each of the three data storage registers thereof wherein said control logic means is effective to reset predetermined total metering pulse count values in the another measuring data storage register means when said pulse count values are equal to a one unit of said kilowatthour and one unit of said kilowatt demand, respectively, with remainder values of a prior one unit kilowatthour and kilowatt demand remaining in the associated one of said another storage register means.

14. A time registering electric energy meter for measuring an AC electric energy quantity in response to time differentiated rates, said meter comprising:
means producing metering pulse signals at a rate responsive to said AC electric energy quantity to be measured;
means including first read-write memory means responsive to said metering pulse signals for accumulating variable coded values of one parameter of said AC electric energy quantity in separate ones of plural measuring data storage register means;
means producing regularly occurring timing signals;
means including second read-write memory means responsive to said timing signals for accumulating variable real time and data coded data in separate ones of plural storage register means, said plural storage register means including minutes, hours, day of the week and day of the year storage register means;
means including third read-write memory means for storing a plurality of fixed rate switch control point data codes in sequential ones of plural storage registers with each of said rate switch point data codes having identical data formats including encoded hour and encoded minutes data in time of day storage register means, an encoded one of a day of the week and a day of the year in a type of day storage register means and an encoded one of said time differentiated rates in a rate code storage register means;
control logic means for sequentially comparing at a predetermined rate of said timing signals the real time and date coded data of said second memory means with the stored rate switch point data codes in a sequential order of comparison being the same as the sequential order of the storage thereof in said third memory means, said control logic further including means responsive to matching of common time and date coded and encoded data of said second and third memory means for producing a current rate switch time logic state therein, said control logic means further including means responsive to said current rate switch time logic state to effect a change in the accumulation of said coded values of said one parameter from one to another of said measuring data storage register means such that said parameter is accumulated in response to the encoded time differentiated rate of the rate switch point data code producing the matched comparison of said second and third memory means;
optoelectronic display means responsive to said control logic means including plural display digit elements and wherein predetermined ones of said digit elements provide numerical readouts of the quantities stored in predetermined ones of said first-named and second-named plural measuring data storage register means; and
further read-write memory means connected with said logic control means and including plural display digit storage register means for encoding the numeric value of one of said quantities to be displayed at an associated one of said digit elements, display sequence timer means responsive to said timing signal for counting predetermined display time intervals; and display data counter storage register means for sequentially storing coded values corresponding to the separate ones of plural measuring data storage register means and being incremented at the end of said display time intervals for effecting a change in the quantity being displayed at the numerical readouts of said display means.

15. A time registering electric energy meter for measuring an AC electric energy quantity in response to time differentiated rates, said meter comprising:
means producing metering pulse signals at a rate responsive to said AC electric energy quantity to be measured;
means including first read-write memory means responsive to said metering pulse signals for accumulating values of one parameter of said AC electric energy quantity in separate ones of plural measuring data storage register means;
means producing regularly occurring timing signals;
means including second read-write memory means responsive to said timing signals for accumulating real time and date coded data in separate ones of plural storage register means, said plural storage register means including minutes, hours, days of the week and day of the year storage register means;
means including third read-write memory means for storing a plurality of rate switch control point data codes in sequential ones of plural storage registers with each of said rate switch point data codes having identical data formats including encoded time of day data, encoded type of day data and encoded rate code data designating one of said time differentiated rates;
control logic means for sequentially comparing at a predetermined rate of said timing signals the real time and date coded data of said second memory means with the stored rate switch point data codes in a sequential order of comparison being the same as the sequential order of the storage thereof in said third memory means, said control logic further including means responsive to matching of common time and date coded and encoded data of said second and third memory means for producing a current rate switch time logic state therein, said control logic means further including means responsive to said current rate switch time logic state to effect a change in the accumulation of said coded values of said one parameter from one to another of said measuring data storage register means such that said parameter is accumulated in response to the encoded time differentiated rate of the rate switch point data code producing the matched comparison of said second and third memory means;
data communication interface means responsive to externally receive data for receiving time and date synchronizing data in said second memory means and transmitting measuring data from said first memory means to external devices for storage and display; and
further read-write memory means including first and second security code data storage registers having coded data transmittable through said data communication interface means, and wherein said control logic means includes means providing new coded data in said first security code data storage register in response to predetermined events and transferring the replaced coded data of said first to said second security code data storage register so as to define old coded data in the second data storage register, the new and old coded data being further transmittable through said data communication interface subsequent to the first-named transmission of the coded data of said first and second security code data storage registers for comparison with said first transmitted coded data, said comparison revealing unauthorized communications with said meter.

* * * * *